(12) United States Patent
Matsunaga

(10) Patent No.: US 12,249,736 B2
(45) Date of Patent: Mar. 11, 2025

(54) BUSBAR MODULE

(71) Applicant: Yazaki Corporation, Tokyo (JP)

(72) Inventor: Yuta Matsunaga, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 453 days.

(21) Appl. No.: 17/728,213

(22) Filed: Apr. 25, 2022

(65) Prior Publication Data

US 2022/0359956 A1 Nov. 10, 2022

(30) Foreign Application Priority Data

May 10, 2021 (JP) ................................ 2021-079412

(51) Int. Cl.
*H01M 50/507* (2021.01)
*H01M 10/42* (2006.01)
*H01M 50/209* (2021.01)
*H01M 50/517* (2021.01)
*H05K 1/18* (2006.01)

(52) U.S. Cl.
CPC ....... *H01M 50/507* (2021.01); *H01M 10/425* (2013.01); *H01M 50/209* (2021.01); *H01M 50/517* (2021.01); *H05K 1/189* (2013.01); H01M 2220/20 (2013.01)

(58) Field of Classification Search
CPC ............. H01M 50/507; H01M 10/425; H01M 50/209; H01M 50/517; H01M 2220/20; H01M 10/482; H01M 50/287; H01M 50/298; H01M 50/503; H01M 50/526; H01M 10/4207; H05K 1/189; H05K 2201/053; H05K 2201/10037; H05K 2201/10272; H05K 1/028; Y02E 60/10
See application file for complete search history.

(56) References Cited

U.S. PATENT DOCUMENTS

| 2018/0090735 | A1* | 3/2018 | Huff .................... H01M 10/486 |
| 2020/0395589 | A1* | 12/2020 | Yasuda ............... H01M 50/519 |
| 2020/0395590 | A1* | 12/2020 | Yasuda ............... H01M 50/298 |
| 2023/0057532 | A1* | 2/2023 | Lu .......................... H01R 25/14 |

FOREIGN PATENT DOCUMENTS

| CN | 112103460 A | 12/2020 |
| JP | 2006-196762 A | 7/2006 |

* cited by examiner

*Primary Examiner* — Muhammad S Siddiquee
(74) *Attorney, Agent, or Firm* — Sughrue Mion, PLLC

(57) ABSTRACT

A busbar module includes: a plurality of busbars that are fixed to a plurality of battery cells of a battery module including the plurality of battery cells; and a plate-like flexible circuit body that includes a plurality of connection conductors corresponding to the plurality of busbars, in which the circuit body includes a trunk portion extending in a first direction in which the plurality of battery cells are arranged, and a plurality of branch portions branching from the trunk portion and connected to the busbars, the circuit body includes a first circuit layer and a second circuit layer, and the branch portion has a thin portion composed of any one of the first circuit layer and the second circuit layer, and connects the trunk portion and the busbar in a state where the thin portion is flexurally deformed.

4 Claims, 20 Drawing Sheets

BUSBAR MODULE

CROSS-REFERENCE TO RELATED APPLICATION(S)

The present application claims priority to and incorporates by reference the entire contents of Japanese Patent Application No. 2021-079412 filed in Japan on May 10, 2021.

BACKGROUND OF THE INVENTION

1. Field of the Invention

The present invention relates to a busbar module.

2. Description of the Related Art

Conventionally, there is a busbar module including a plurality of busbars fixed to battery cells of a battery module. The busbar module includes, for example, a trunk portion including a plurality of connection conductors and a branch portion branching from the trunk portion and connected to the busbar. The trunk portion needs to be downsized in order to be disposed in a limited space.

Japanese Patent Application Laid-open No. 2006-196762 discloses a flexible multilayer wiring board including a cable portion that includes an inner layer substrate including a plurality of conductive layers with a flexible insulating layer interposed therebetween, and a multilayer wiring portion in which an outer layer substrate including an insulating layer and a conductive layer is partially stacked on a surface of the inner layer substrate.

The flexible multilayer wiring board as in Japanese Patent Application Laid-open No. 2006-196762 is likely to have a complicated configuration. It is desired to implement downsizing of a circuit body with a simple configuration. For example, it is desirable to make the connection conductors have a multilayer structure with a simple configuration. The branch portion of the circuit body preferably has flexibility so that the busbar can be fixed to the battery cell while absorbing tolerance of the battery module.

SUMMARY OF THE INVENTION

An object of the present invention is to provide a busbar module capable of implementing both a multilayer structure of connection conductors with a simple configuration and flexibility of a branch portion.

In order to achieve the above mentioned object, a busbar module according to one aspect of the present invention includes a plurality of busbars configured to be fixed to a plurality of battery cells of a battery module including the plurality of battery cells; and a plate-like flexible circuit body that includes a plurality of connection conductors corresponding to the plurality of busbars, wherein the circuit body includes a trunk portion extending in a first direction in which the plurality of battery cells are arranged, and a plurality of branch portions branching from the trunk portion and connected to the busbars, the circuit body includes a first circuit layer and a second circuit layer, the first circuit layer is composed of a base layer, a first coating layer covering a first surface of the base layer, and a first conductor layer disposed between the first surface and the first coating layer, the second circuit layer is composed of the base layer, a second coating layer covering a second surface of the base layer, and a second conductor layer disposed between the second surface and the second coating layer, and the branch portion has a thin portion composed of any one of the first circuit layer and the second circuit layer, and connects the trunk portion and the busbar in a state where the thin portion is flexurally deformed.

According to another aspect of the present invention, in the busbar module, it is preferable that the branch portion includes a base portion protruding from the trunk portion in a direction intersecting the first direction, a fixed portion fixed to the busbar, and an intermediate portion extending from the base portion to the fixed portion in the first direction, and the thin portion is provided at the intermediate portion.

According to still another aspect of the present invention, in the busbar module, it is preferable that the base portion includes both the first circuit layer and the second circuit layer.

According to still another aspect of the present invention, in the busbar module, it is preferable that the connection conductor is a metal foil, one of the first conductor layer and the second conductor layer included in the base portion is composed of the connection conductor, and the other of the first conductor layer and the second conductor layer included in the base portion is a reinforcing layer formed of a metal foil, the reinforcing layer being insulated from the connection conductor.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, a busbar module according to an embodiment of the present invention will be described in detail with reference to the drawings. Note that the present invention is not limited by the embodiment. In addition, constituent elements in the following embodiment include those that can be easily assumed by those skilled in the art or those that are substantially the same.

Embodiment

Figure 1:
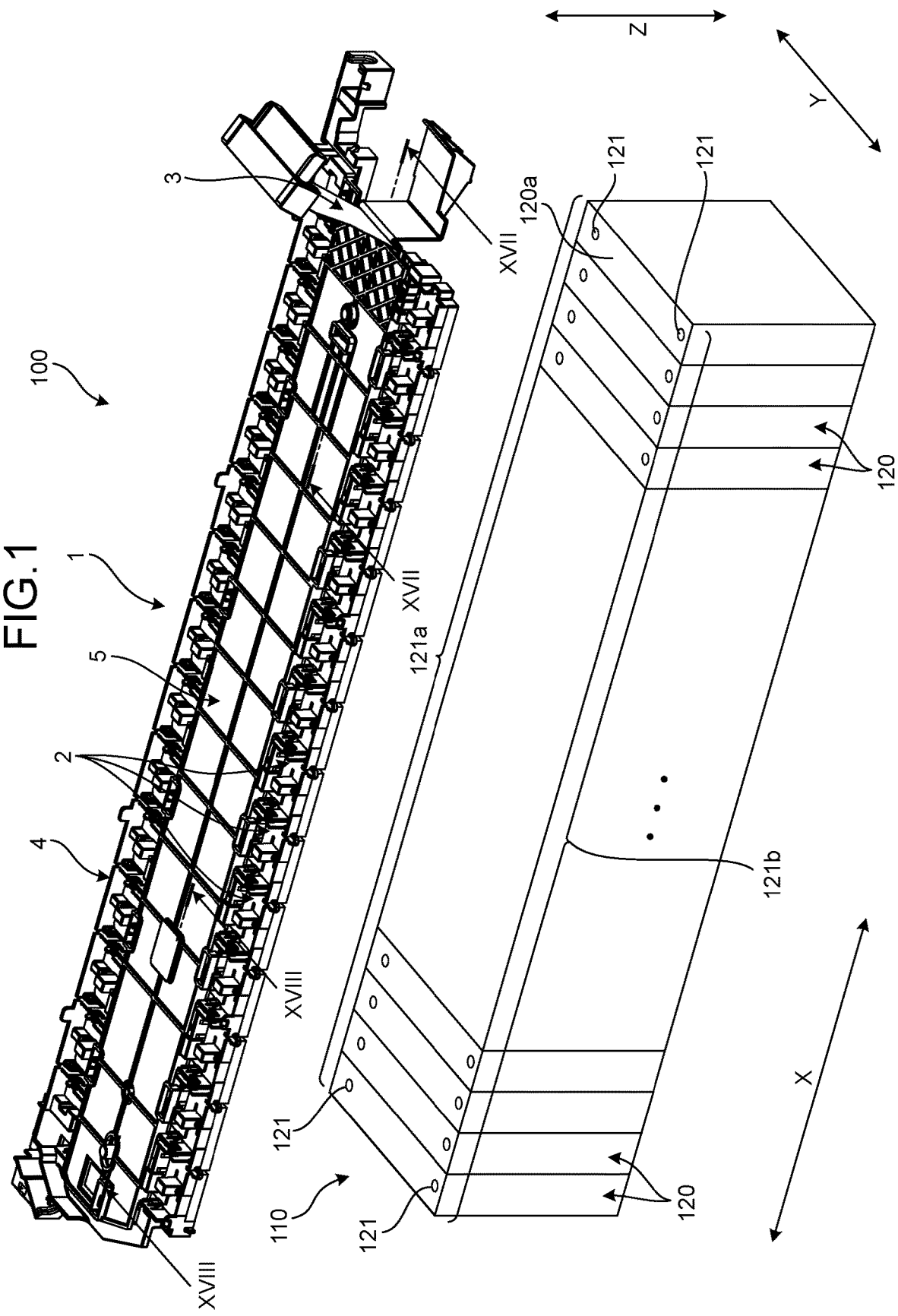
FIG. 1 is a perspective view of a busbar module and a battery module according to an embodiment.
Figure 2:
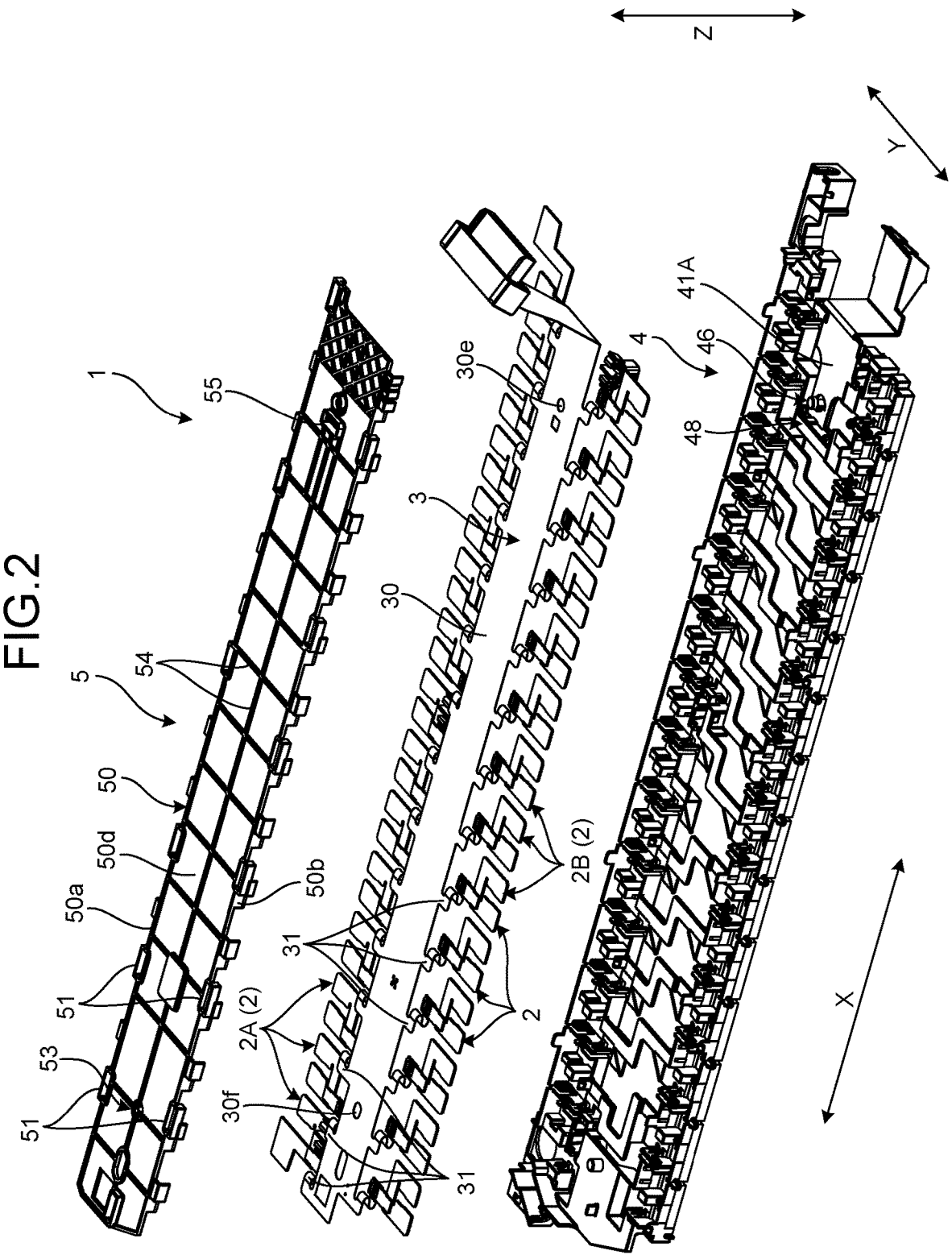
FIG. 2 is an exploded perspective view of the busbar module according to the embodiment.
Figure 3:
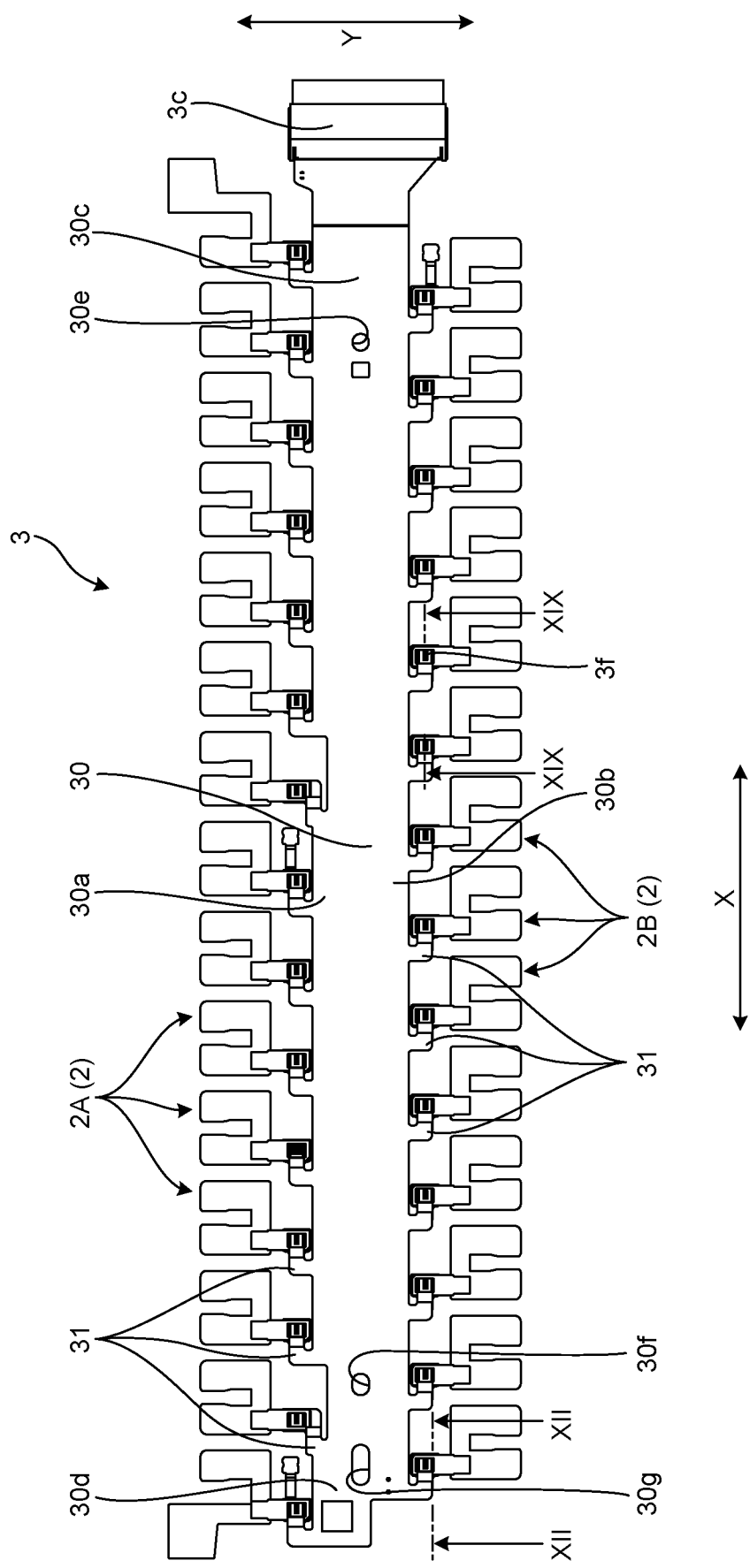
FIG. 3 is a plan view of a circuit body and a busbar according to the embodiment.
Figure 4:
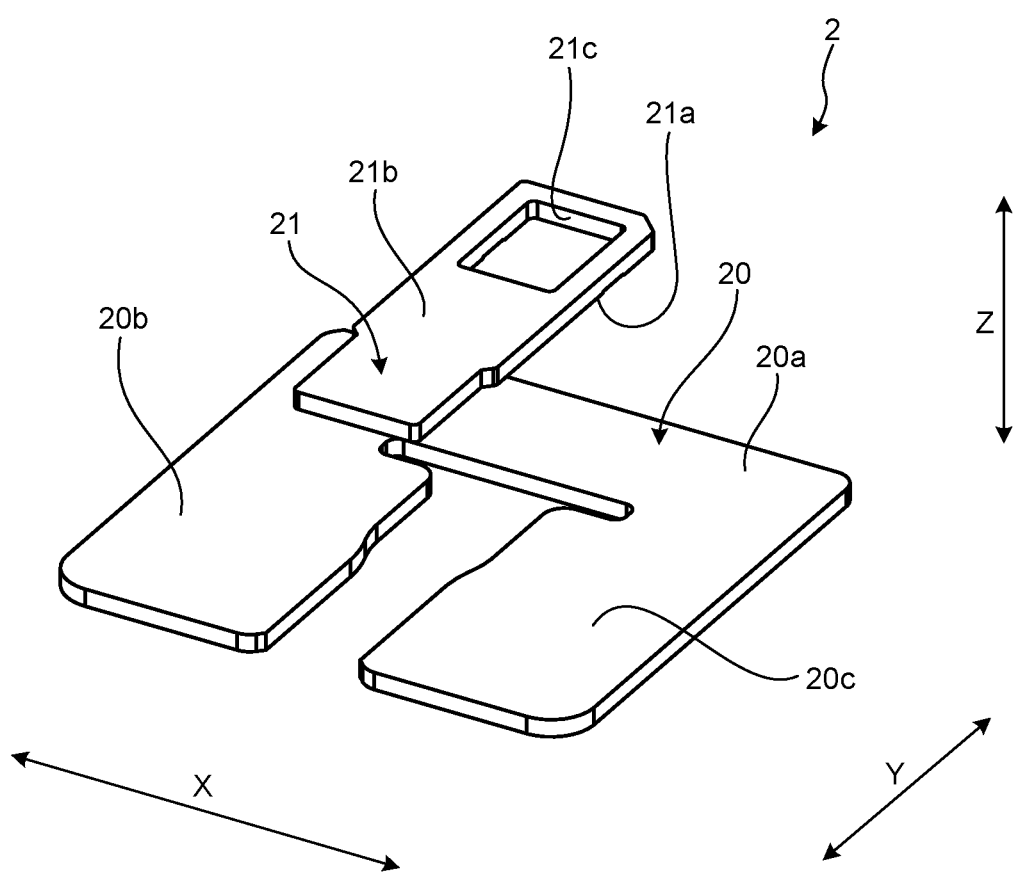
FIG. 4 is a perspective view of the busbar according to the embodiment.
Figure 5:
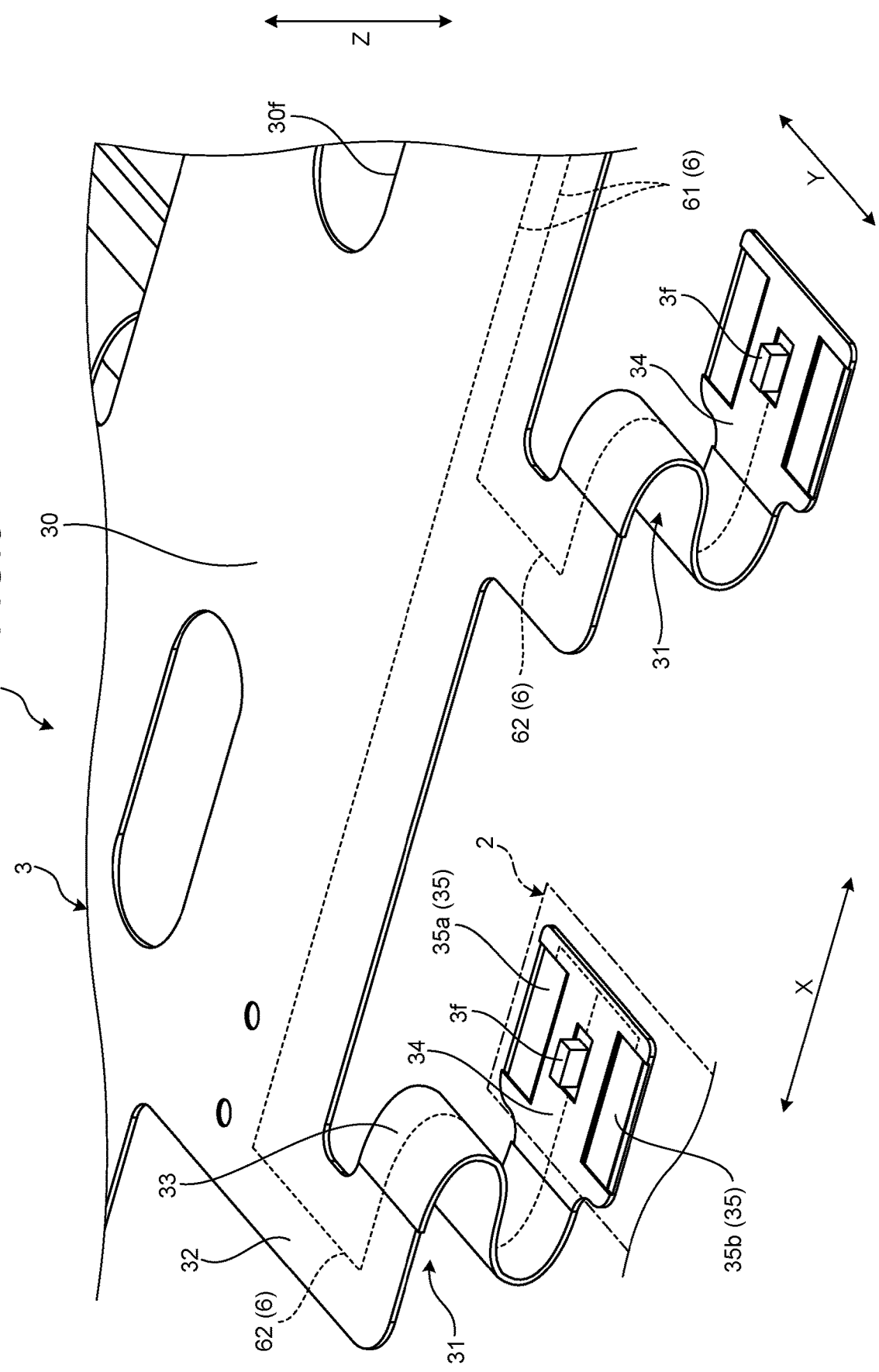
FIG. 5 is a perspective view illustrating a main part of the circuit body according to the embodiment.
Figure 6:
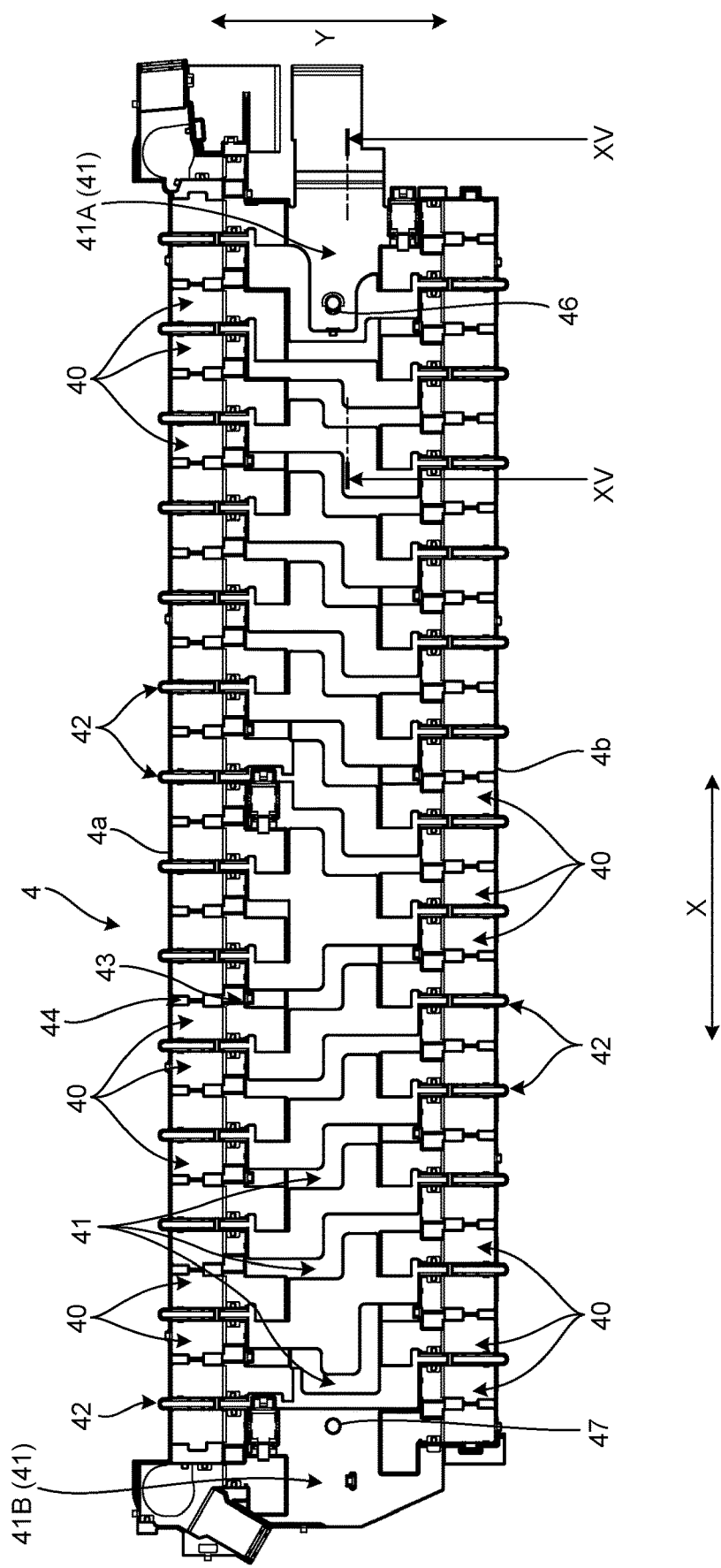
FIG. 6 is a plan view of a case according to the embodiment.
Figure 7:
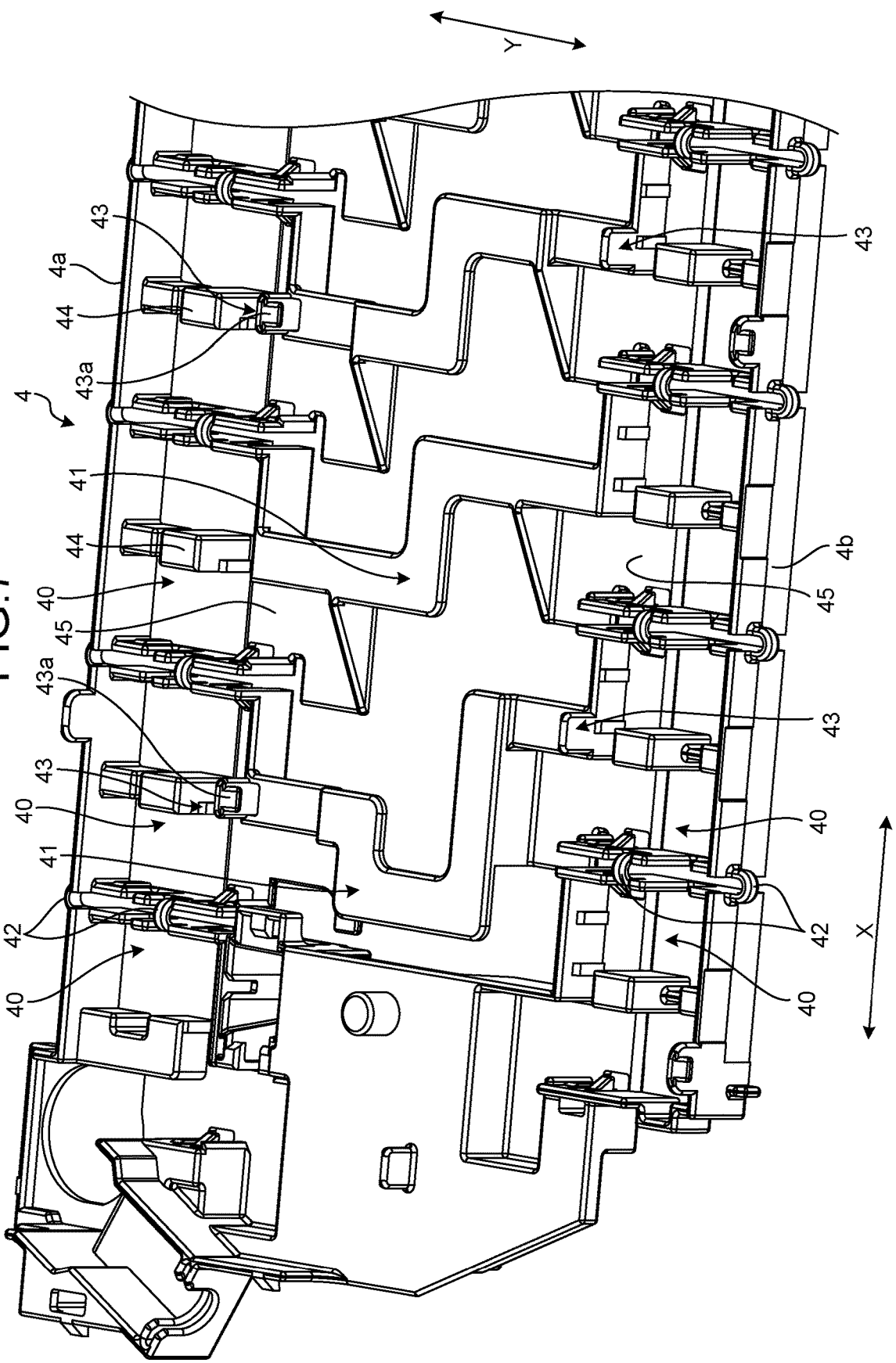
FIG. 7 is a perspective view of the case according to the embodiment.
Figure 8:
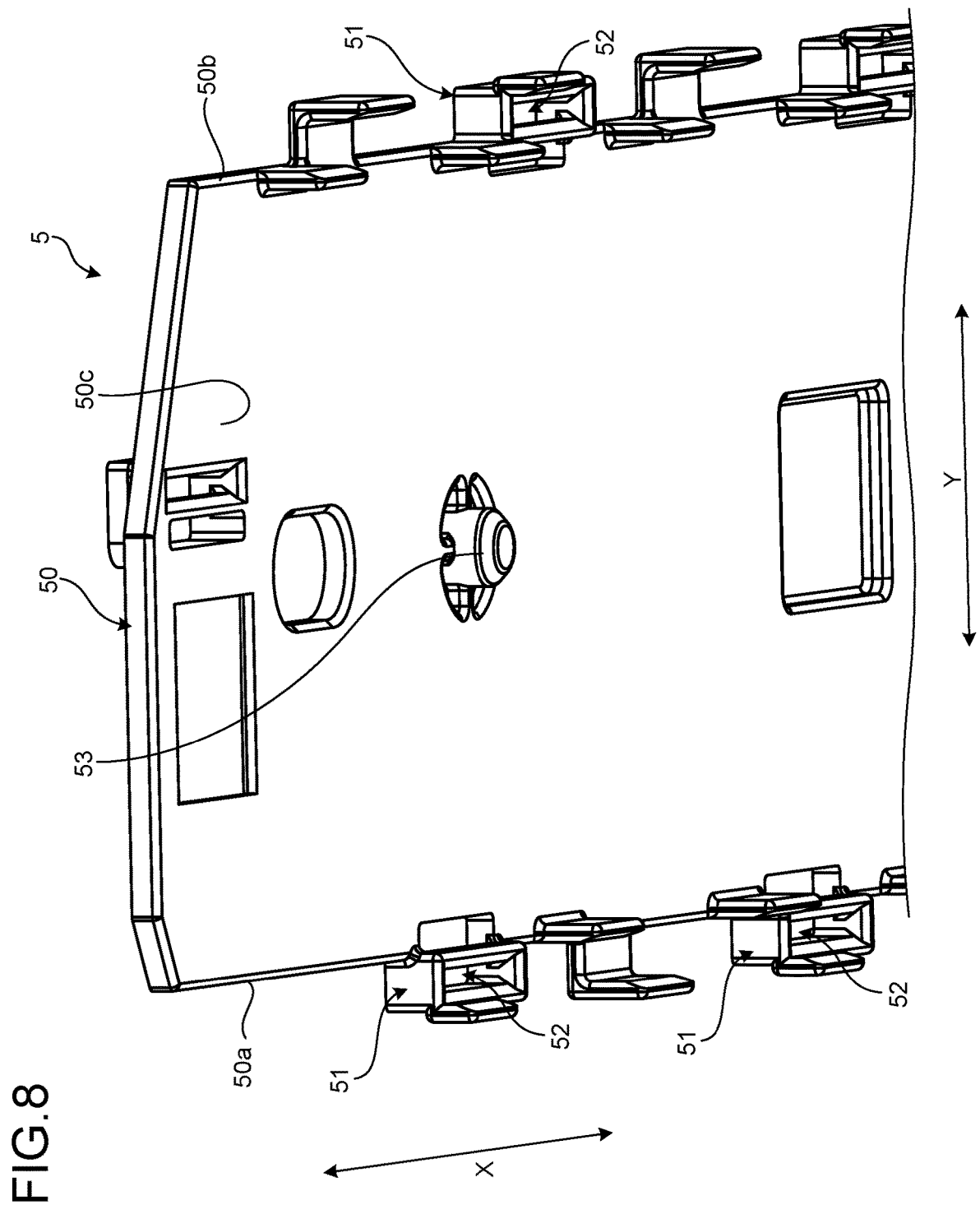
FIG. 8 is a perspective view of a cover according to the embodiment.
Figure 9:
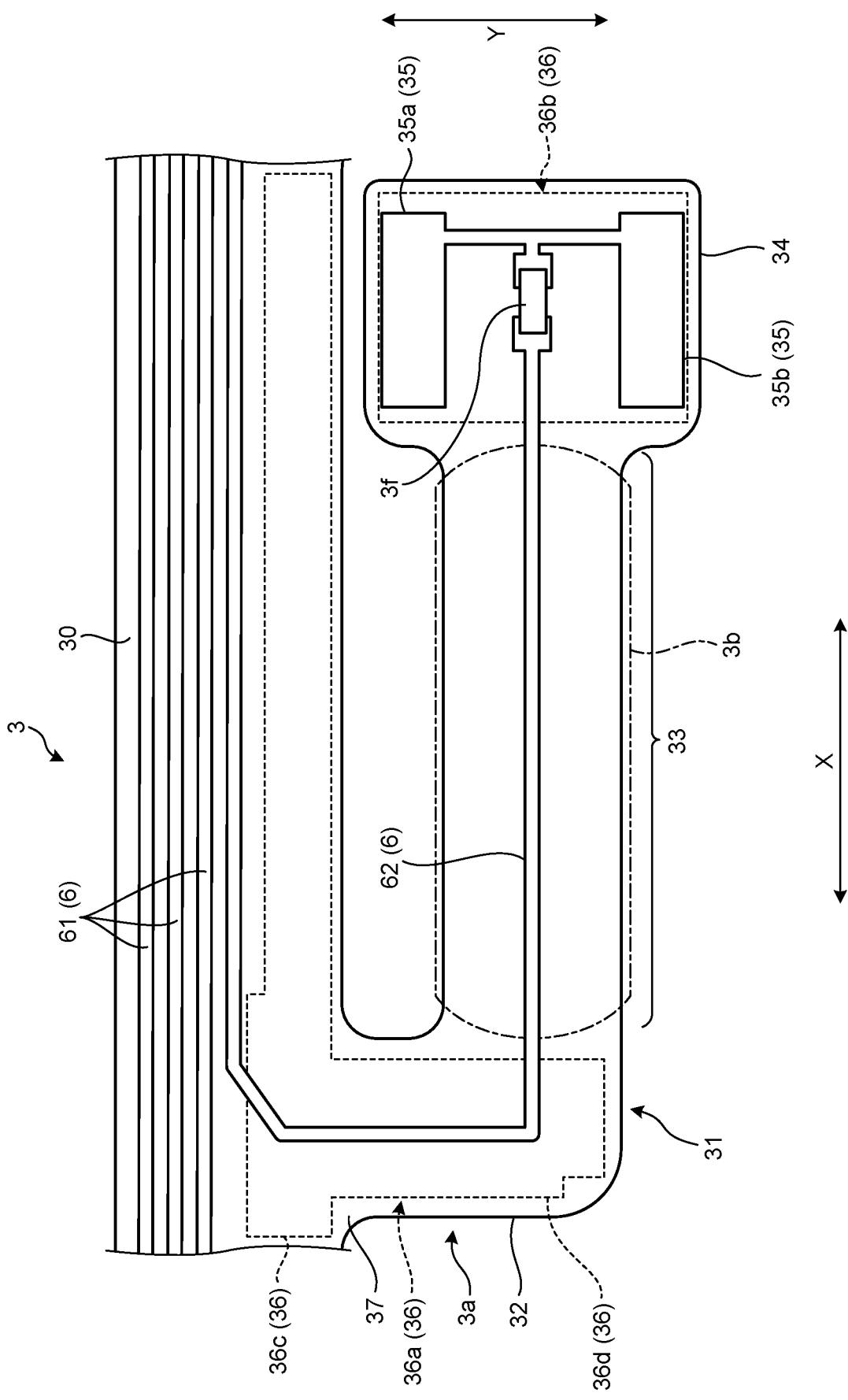
FIG. 9 is a view for describing an internal configuration of the circuit body according to the embodiment.

An embodiment will be described with reference to FIGS. 1 to 21. The present embodiment relates to a busbar module. FIG. 1 is a perspective view of a busbar module and a battery module according to the embodiment, FIG. 2 is an exploded perspective view of the busbar module according to the embodiment, FIG. 3 is a plan view of a circuit body and a busbar according to the embodiment, FIG. 4 is a perspective view of the busbar according to the embodiment, FIG. 5 is a perspective view illustrating a main part of the circuit body according to the embodiment, FIG. 6 is a plan view of a case according to the embodiment, FIG. 7 is a perspective view of the case according to the embodiment, FIG. 8 is a perspective view of a cover according to the embodiment, and FIG. 9 is a view for describing an internal configuration of the circuit body according to the embodiment.

Figure 10:
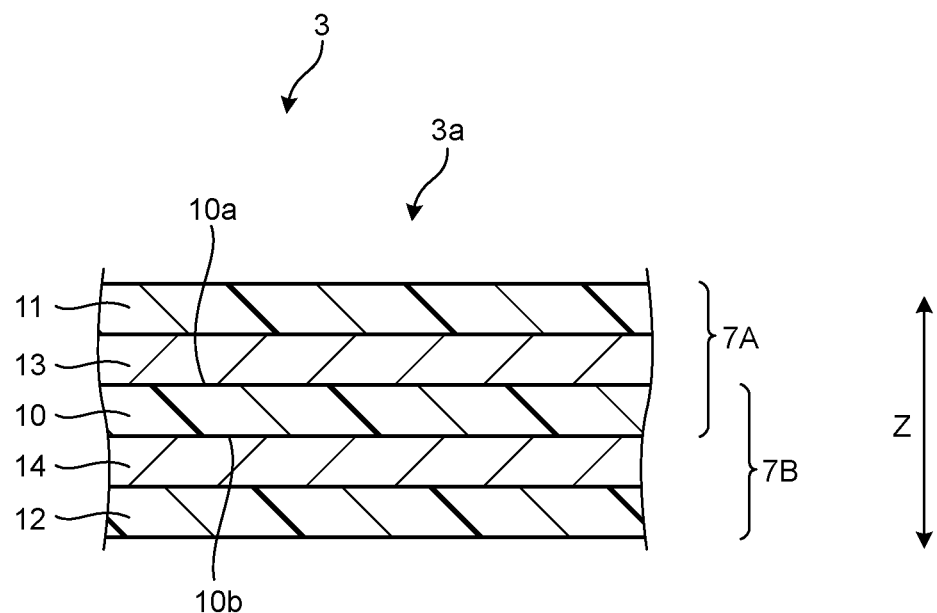
FIG. 10 is a cross-sectional view of a thick portion of the circuit body according to the embodiment.
Figure 11:
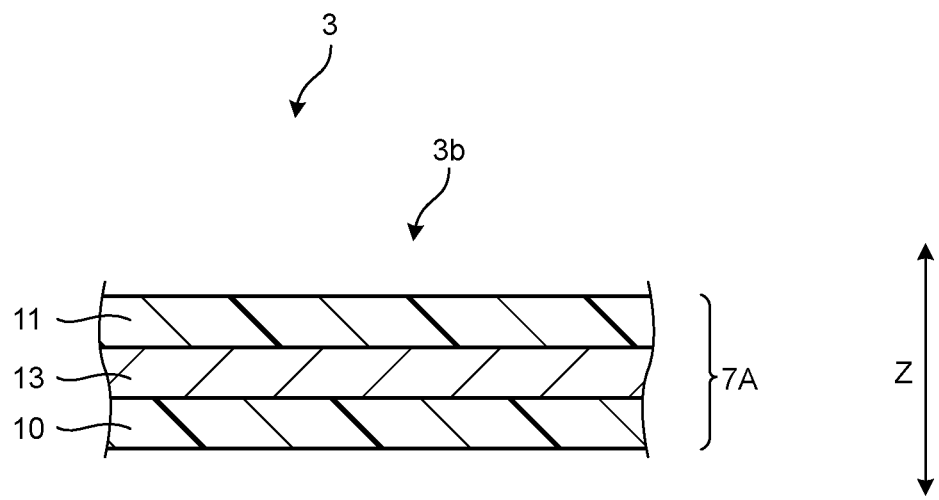
FIG. 11 is a cross-sectional view of a thin portion of the circuit body according to the embodiment.
Figure 12:
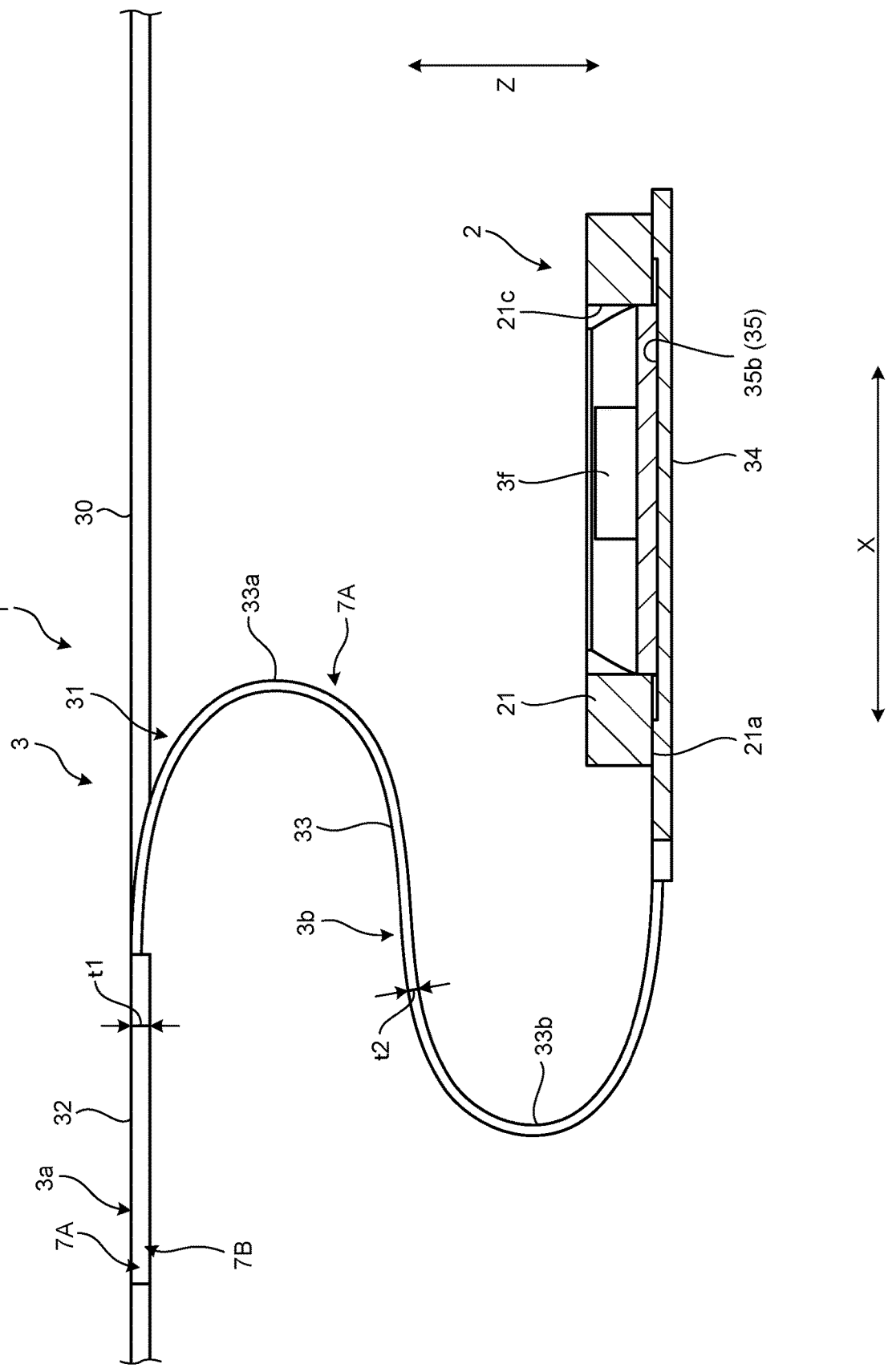
FIG. 12 is a cross-sectional view of the circuit body according to the embodiment.
Figure 13:
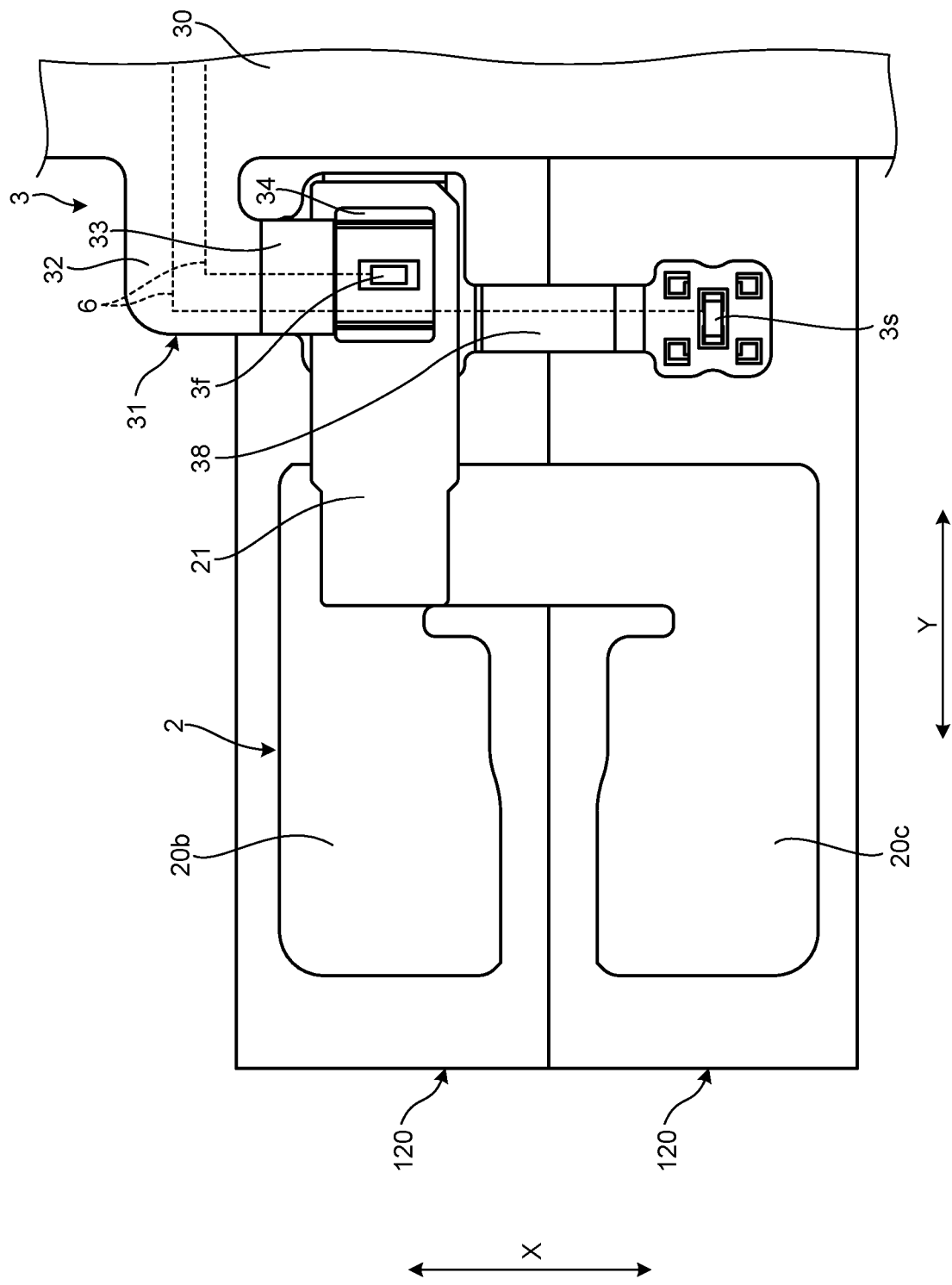
FIG. 13 is a perspective view of the circuit body according to the embodiment.
Figure 14:
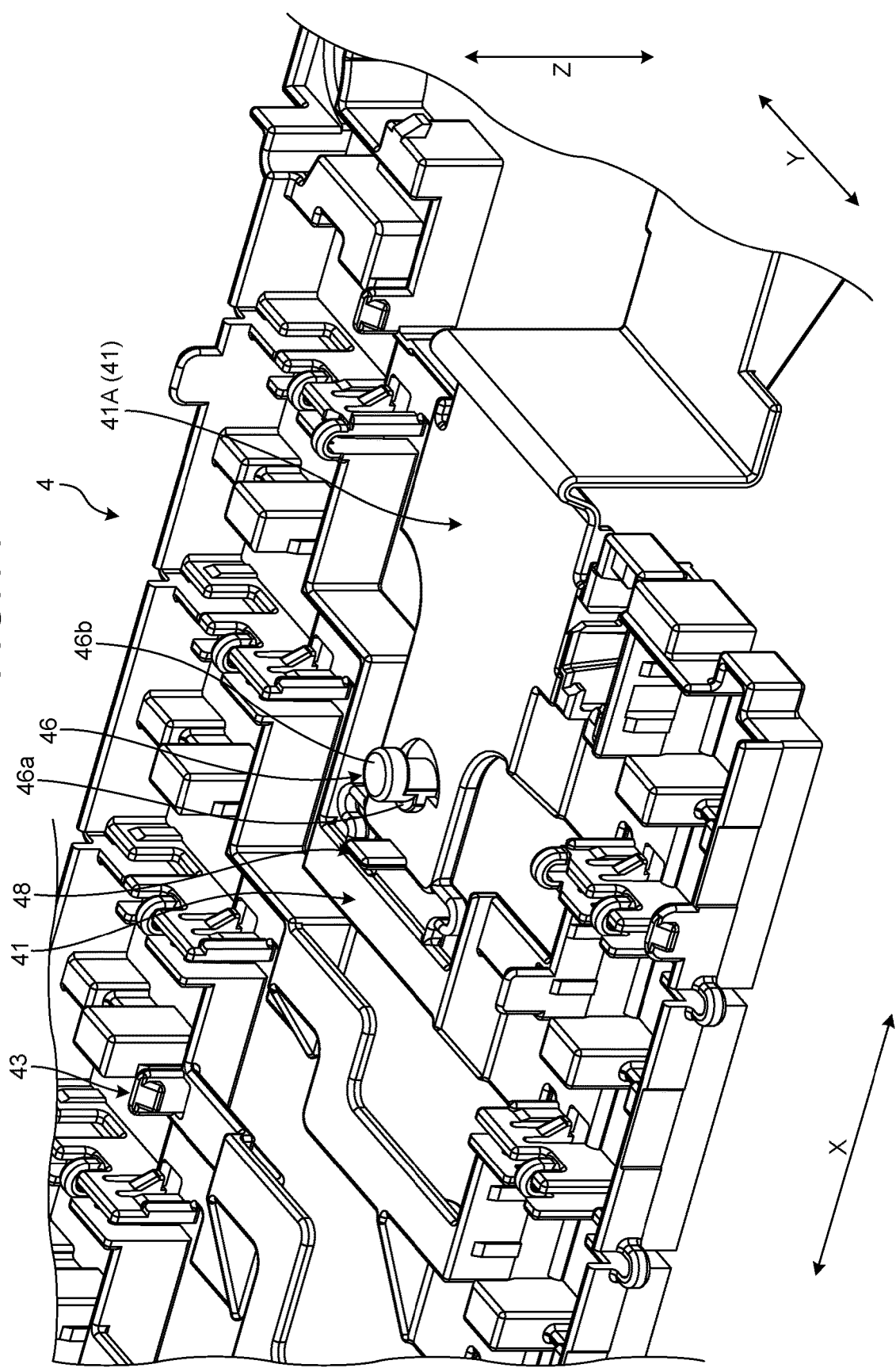
FIG. 14 is a perspective view of the case according to the embodiment.
Figure 15:
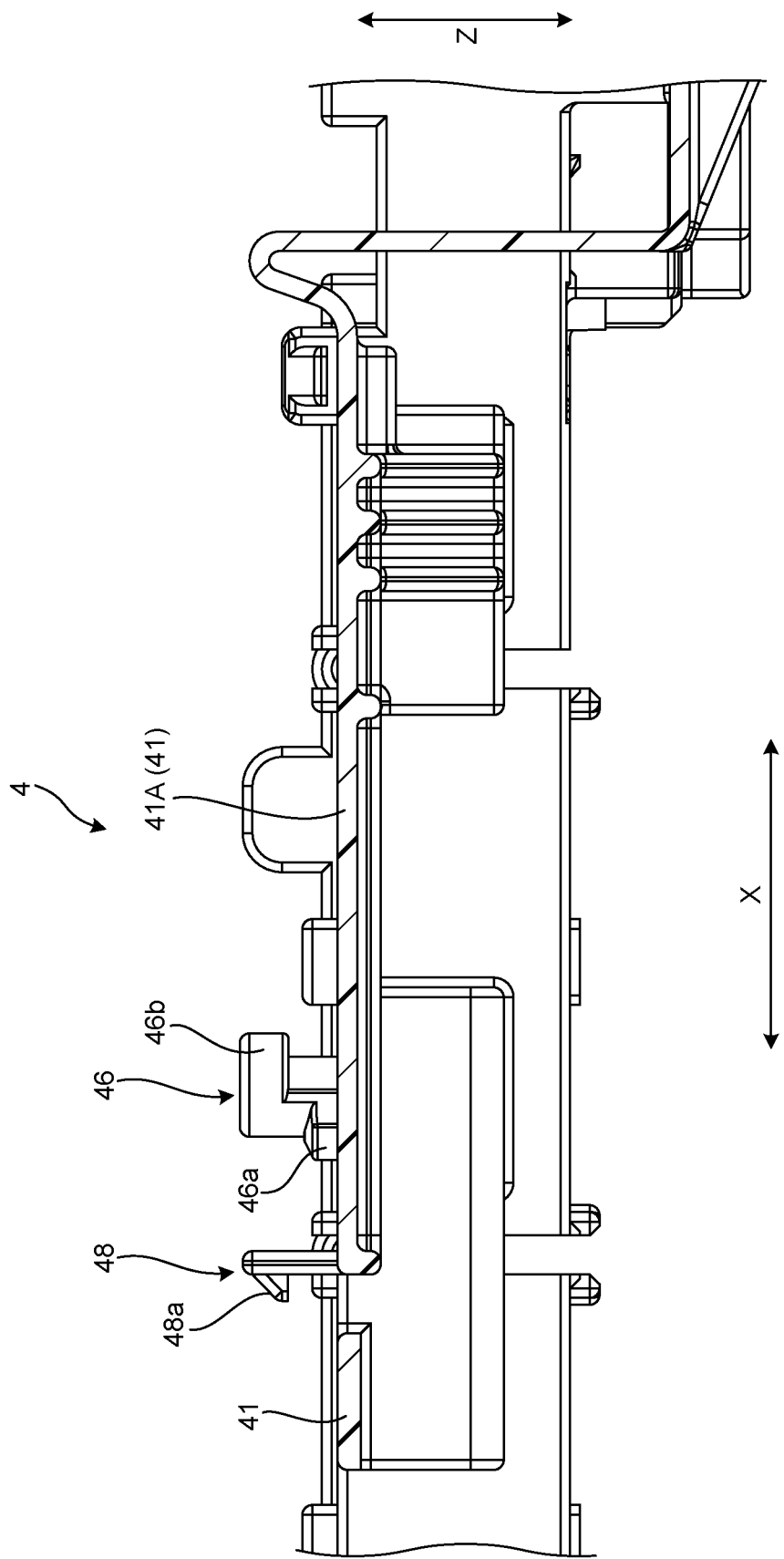
FIG. 15 is a cross-sectional view of the case according to the embodiment.
Figure 16:
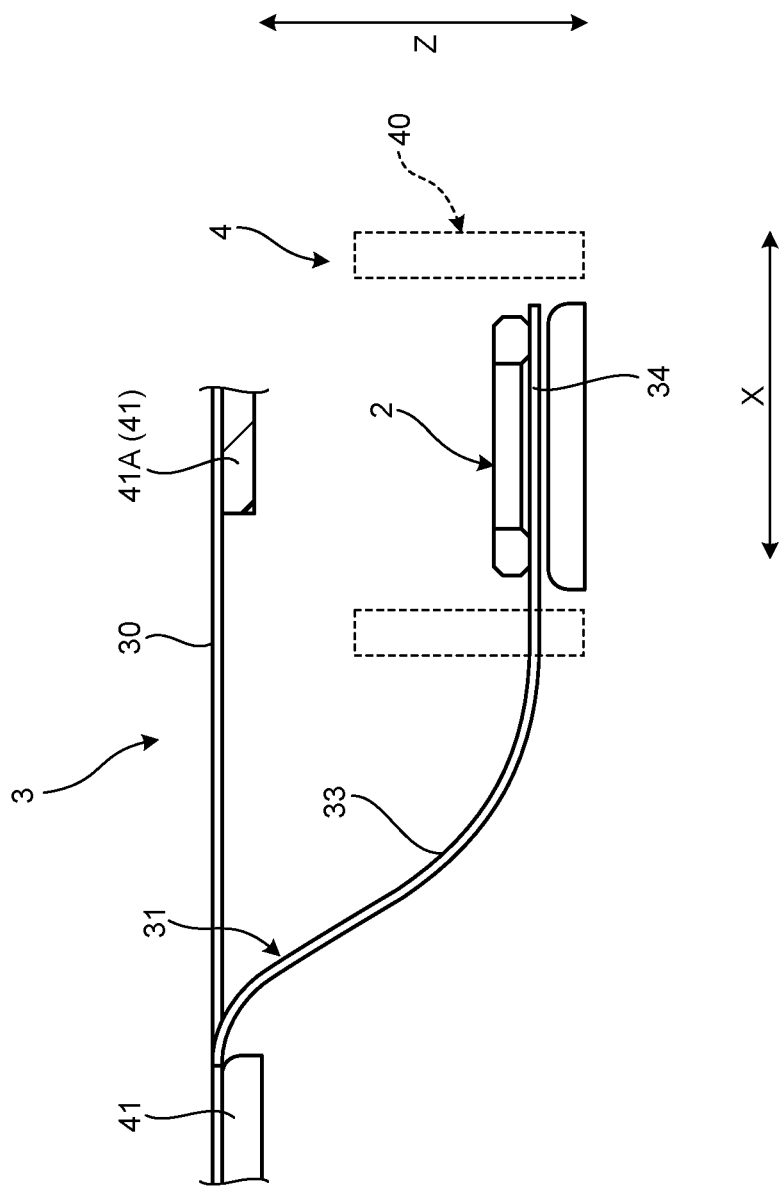
FIG. 16 is a side view of the case and the circuit body according to the embodiment.
Figure 17:
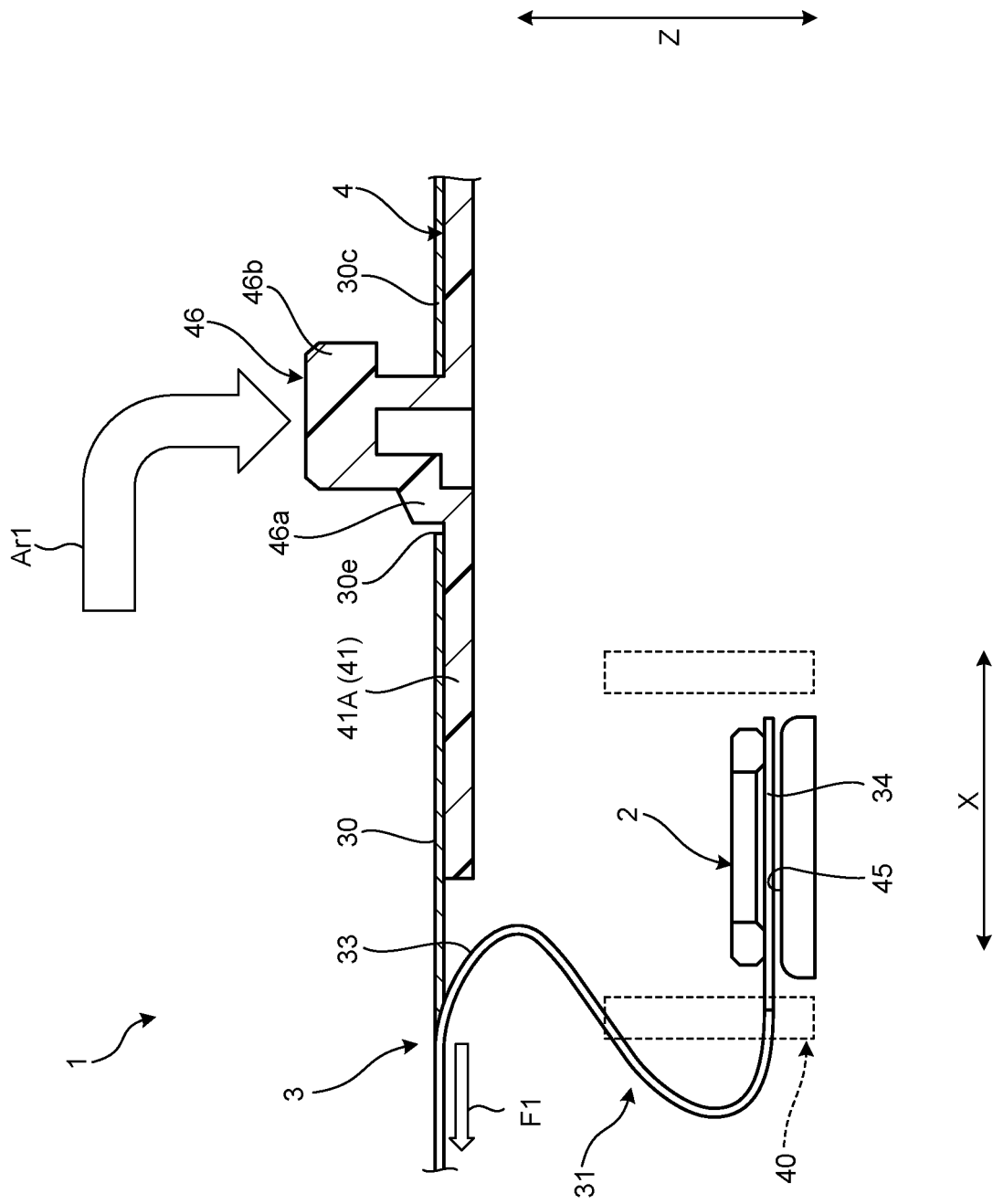
FIG. 17 is a cross-sectional view of the case and the circuit body according to the embodiment.
Figure 18:
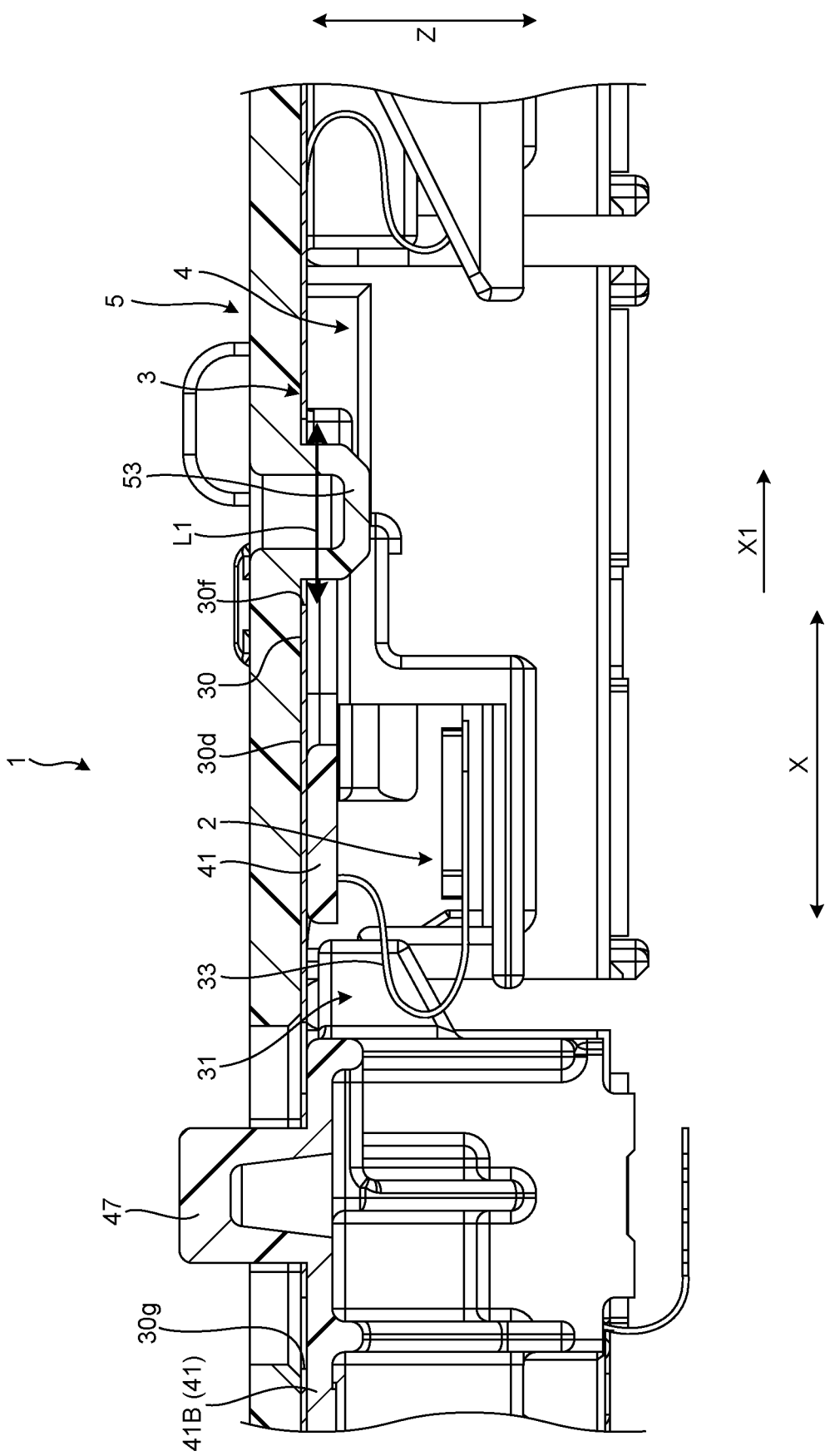
FIG. 18 is a cross-sectional view of the busbar module according to the embodiment.
Figure 19:
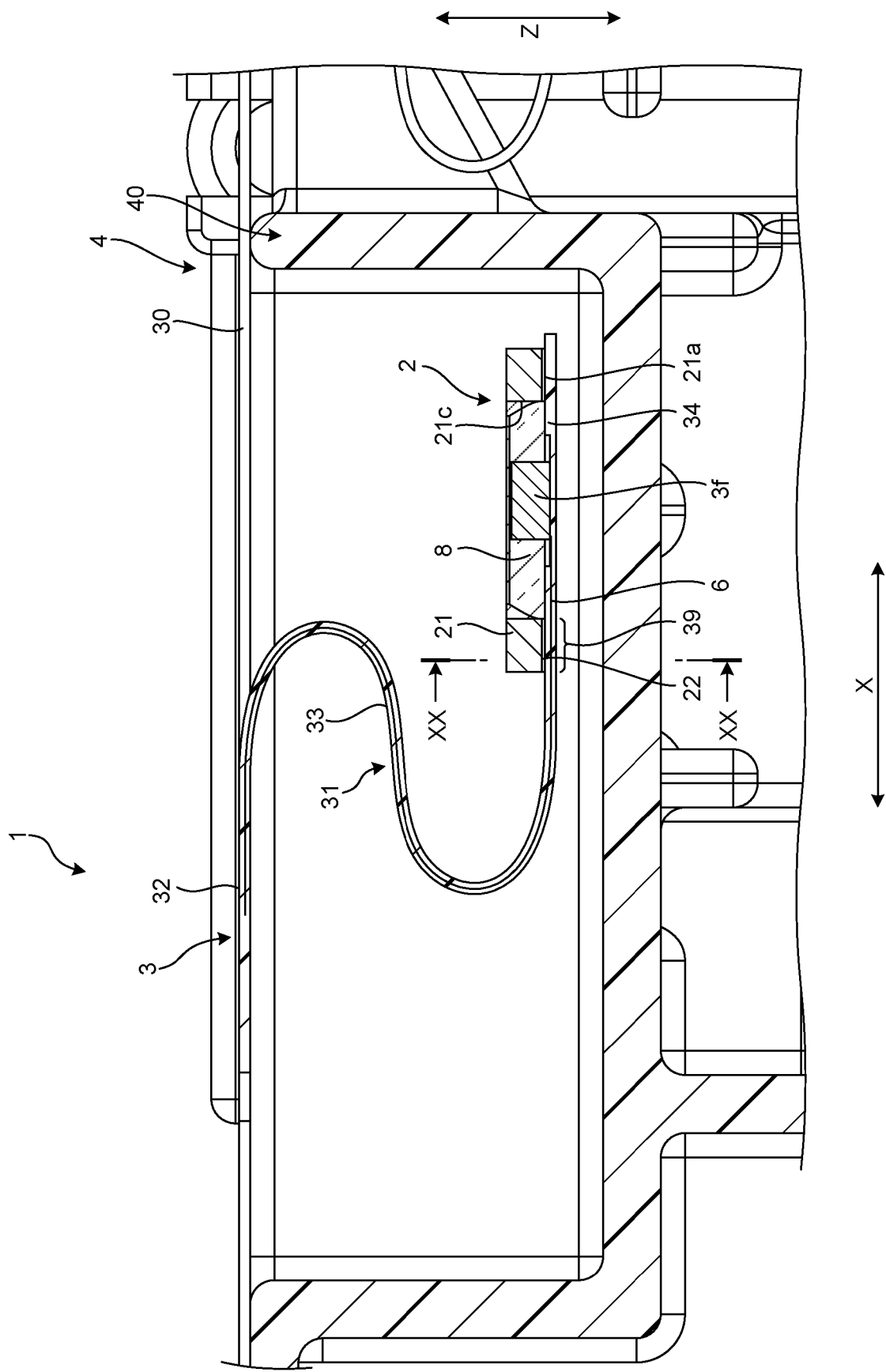
FIG. 19 is a cross-sectional view of the circuit body and the busbar according to the embodiment.
Figure 20:
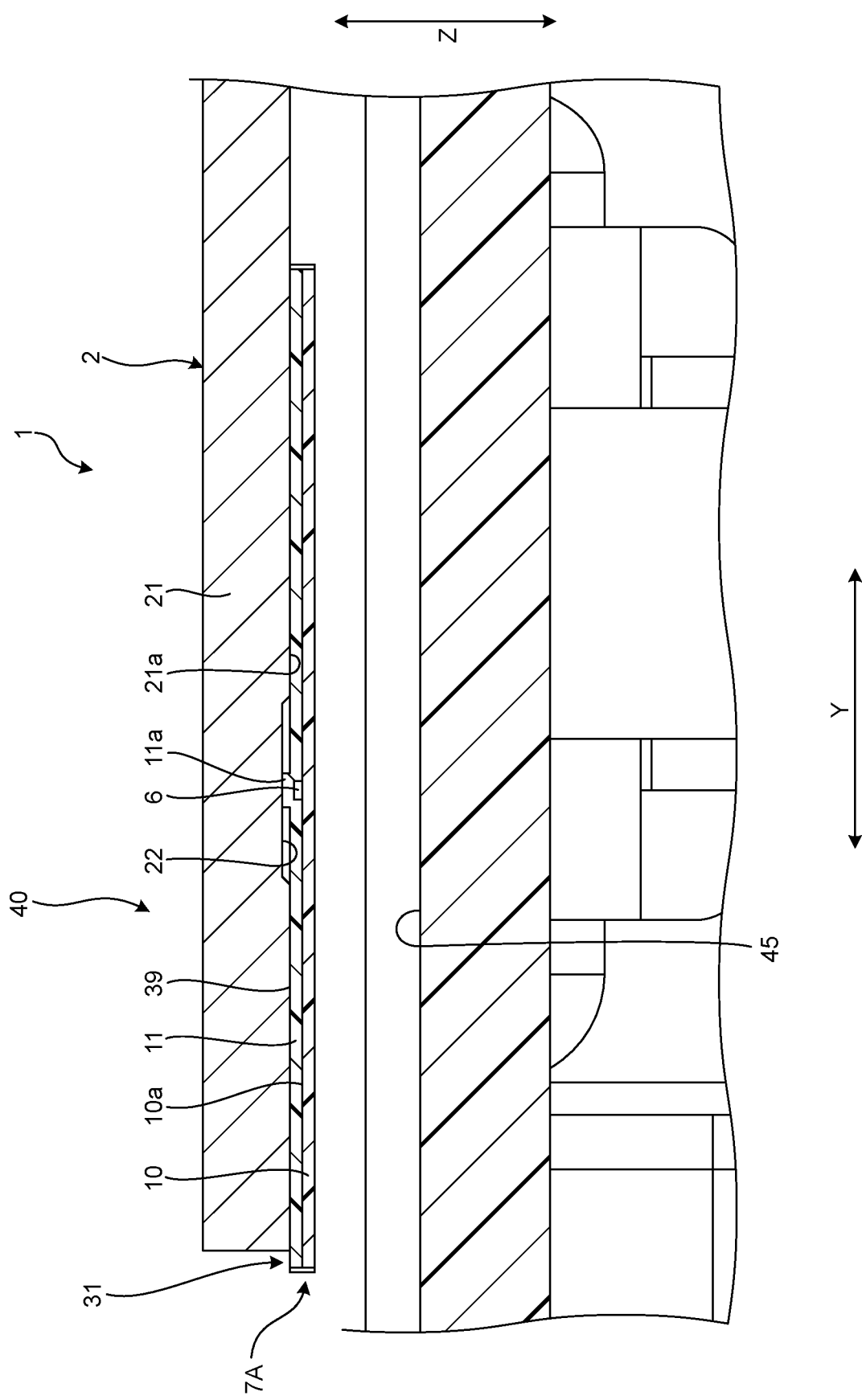
FIG. 20 is a cross-sectional view of the circuit body and the busbar according to the embodiment.
Figure 21:
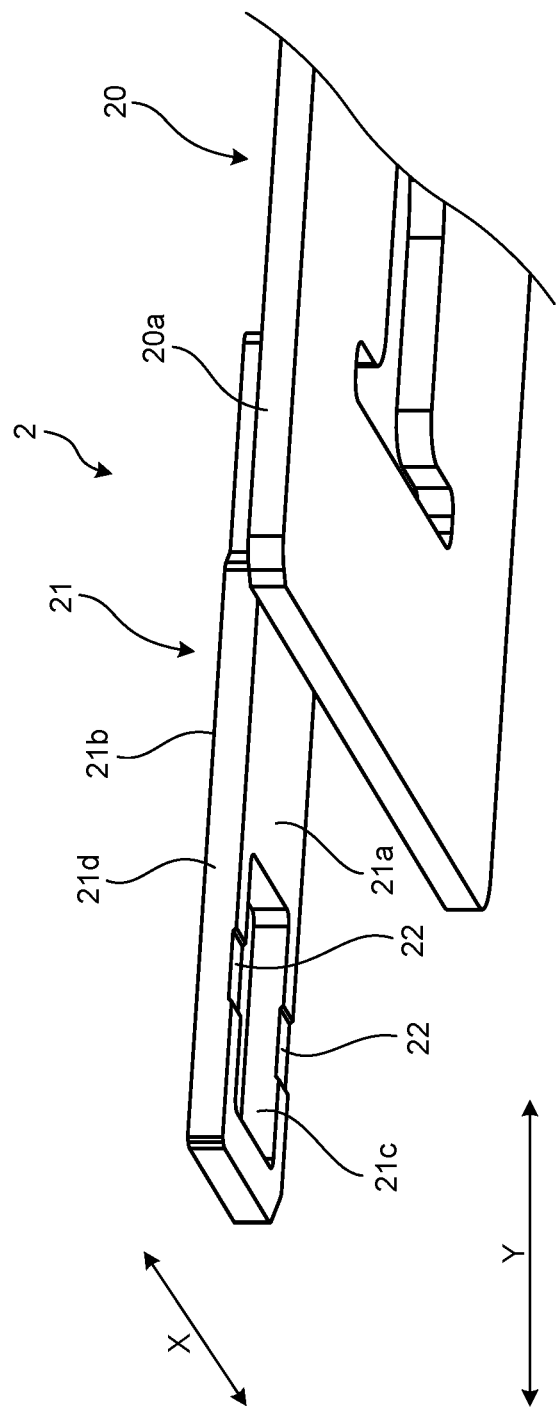
FIG. 21 is a perspective view of the busbar according to the embodiment.

FIG. 10 is a cross-sectional view of a thick portion of the circuit body according to the embodiment, FIG. 11 is a cross-sectional view of a thin portion of the circuit body according to the embodiment, FIG. 12 is a cross-sectional view of the circuit body according to the embodiment, FIG. 13 is a perspective view of the circuit body according to the embodiment, FIG. 14 is a perspective view of the case according to the embodiment, FIG. 15 is a cross-sectional view of the case according to the embodiment, FIG. 16 is a side view of the case and the circuit body according to the embodiment, FIG. 17 is a cross-sectional view of the case and the circuit body according to the embodiment, FIG. 18 is a cross-sectional view of the busbar module according to the embodiment, FIGS. 19 and 20 are cross-sectional views of the circuit body and the busbar according to the embodiment, and FIG. 21 is a perspective view of the busbar according to the embodiment. FIG. 12 illustrates a cross section taken along line XII-XII in FIG. 3. FIG. 15 illustrates a cross section taken along line XV-XV in FIG. 6. FIG. 17 illustrates a cross section taken along line XVII-XVII in FIG. 1. FIG. 18 illustrates a cross section taken along line XVIII-XVIII in FIG. 1. FIG. 19 illustrates a cross section taken along line XIX-XIX in FIG. 3. FIG. 20 illustrates a cross section taken along line XX-XX in FIG. 19.

As illustrated in FIG. 1, a battery pack 100 of the present embodiment includes a busbar module 1 and a battery module 110. The battery pack 100 is mounted as a power source on a vehicle such as an electric vehicle (EV), a hybrid electric vehicle (HEV), or a plug-in hybrid electric vehicle (PHEV). The battery pack 100 may include a plurality of busbar modules 1 and a plurality of battery modules 110.

The battery module 110 includes a plurality of battery cells 120. The illustrated shape of the battery cell 120 is a rectangular parallelepiped shape. Two electrodes 121 are disposed on a first surface 120a of the battery cell 120. The first surface 120a has a substantially rectangular shape.

The plurality of battery cells 120 are arranged in a first direction X. More specifically, the plurality of battery cells 120 are arranged in such a manner that a longer side of the first surface 120a faces a longer side of another adjacent first surface 120a in the first direction X. In the following description, a direction orthogonal to the first direction X on the first surface 120a is referred to as a "second direction Y". The second direction Y is a longitudinal direction of the first surface 120a. A direction orthogonal to both the first direction X and the second direction Y is referred to as a "third direction Z". The third direction Z is a height direction of the battery cell 120. The first surface 120a is orthogonal to the third direction Z. For example, the battery pack 100 is mounted on the vehicle in such a manner that the first surface 120a faces upward in a top-bottom direction of the vehicle.

The two electrodes 121 on the first surface 120a are arranged in the second direction Y. One of the two electrodes 121 on the first surface 120a is a positive electrode, and the other is a negative electrode. An aggregate of the electrodes 121 arranged at one ends of the first surfaces 120a in the longitudinal direction is referred to as a "first electrode group 121a". An aggregate of the electrodes 121 arranged at the other ends of the first surfaces 120a in the longitudinal direction is referred to as a "second electrode group 121b". In the battery module 110 of the present embodiment, the positive electrodes and the negative electrodes are alternately arranged in the first electrode group 121a. In the second electrode group 121b, the positive electrodes and the negative electrodes are alternately arranged. The busbar module 1 of the present embodiment connects the plurality of battery cells 120 in series.

The busbar module 1 includes a plurality of busbars 2, a plate-like circuit body 3, a case 4, and a cover 5. The busbar 2 is formed of a conductive metal plate such as copper or aluminum. As illustrated in FIGS. 2 and 3, the busbar module 1 includes a first busbar group 2A and a second busbar group 2B. The first busbar group 2A and the second busbar group 2B include the plurality of busbars 2 arranged in the first direction X. The busbars 2 of the first busbar group 2A are fixed to the first electrode group 121a of the battery module 110. The busbars 2 of the second busbar group 2B are fixed to the second electrode group 121b.

As illustrated in FIG. 4, the busbar 2 includes a main body 20 and a terminal 21. The main body 20 and the terminal 21 are electrically connected by welding or the like, for example. The main body 20 electrically connects two electrodes 121 adjacent to each other in the first direction X. The main body 20 includes a base portion 20a, a first connecting portion 20b, and a second connecting portion 20c. The base portion 20a has a rectangular flat plate shape and is orthogonal to the third direction Z.

The first connecting portion 20b and the second connecting portion 20c are arranged with a gap in the first direction X and protrude from the base portion 20a in the second direction Y. The first connecting portion 20b and the second connecting portion 20c are orthogonal to the third direction Z. The first connecting portion 20b is connected to one electrode 121 of two adjacent electrodes 121. The second connecting portion 20c is connected to the other electrode 121 of the two adjacent electrodes 121. Each of the first connecting portion 20b and the second connecting portion 20c may be connected to the electrode 121 by welding, may be connected to the electrode 121 by a fastening member, or may be connected to the electrode 121 by other means.

The terminal 21 has a flat plate shape and is fixed to the base portion 20a of the main body 20. The terminal 21 protrudes with respect to the base portion 20a toward a side opposite from a side of the first connecting portion 20b and the second connecting portion 20c. The terminal 21 has a first surface 21a and a second surface 21b. The first surface 21a is one of two main surfaces of the terminal 21, and faces the base portion 20a in the third direction Z. The second surface 21b is the other of the two main surfaces of the terminal 21.

A through-hole 21c penetrating through the terminal 21 in a thickness direction is formed in the terminal 21. The through-hole 21c is disposed at a distal end portion of the terminal 21. The through-hole 21c is opened in each of the first surface 21a and the second surface 21b.

The circuit body 3 is a plate-like circuit body and has flexibility. The circuit body 3 of the present embodiment is a flexible printed circuit (FPC). The circuit body 3 includes a plurality of connection conductors 6 corresponding to the plurality of busbars 2. As illustrated in FIGS. 2 and 3, the circuit body 3 includes a trunk portion 30 and a plurality of branch portions 31. The trunk portion 30 and the branch portion 31 are integrally formed.

The trunk portion 30 has a flat plate shape and extends along the first direction X. As illustrated in FIG. 3, the trunk portion 30 has a first side 30a and a second side 30b extending along the first direction X. The first side 30a is an edge of one end of the trunk portion 30 in the second direction Y. The second side 30b is an edge of the other end of the trunk portion 30 in the second direction Y. The branch portion 31 branches from the trunk portion 30. The illustrated circuit body 3 includes the plurality of branch portions 31 branching from the first side 30a and the plurality of branch portions 31 branching from the second side 30b. The branch portion 31 connected to the first side 30a is connected to the busbar 2 of the first busbar group 2A. The branch portion 31 connected to the second side 30b is connected to the busbar 2 of the second busbar group 2B.

The trunk portion 30 has a first end portion 30c and a second end portion 30d. The first end portion 30c is one end portion of the trunk portion 30 in the first direction X. The second end portion 30d is the other end portion of the trunk portion 30 in the first direction X. A connector 3c is connected to the first end portion 30c. The trunk portion 30 is connected to a monitoring device that monitors a state of the battery module 110 via the connector 3c. The monitoring device monitors, for example, a voltage and temperature of the battery cell 120.

A first through-hole 30e is provided in the first end portion 30c. A second through-hole 30f and a third through-hole 30g are provided in the second end portion 30d. The first through-hole 30e, the second through-hole 30f, and the third through-hole 30g penetrate through the trunk portion 30 in the third direction Z. The first through-hole 30e, the second through-hole 30f, and the third through-hole 30g are disposed, for example, at the center of the trunk portion 30 in the second direction Y. The illustrated shape of the first through-hole 30e is a circular shape having a uniform diameter. The illustrated shapes of the second through-hole 30f and the third through-hole 30g are oval shapes along the first direction X. In the first direction X, a length of the third through-hole 30g is larger than a length of the second through-hole 30f.

As illustrated in FIG. 5, the branch portion 31 includes a base portion 32, an intermediate portion 33, and a fixed portion 34. The base portion 32 protrudes from the trunk portion 30 toward the second direction Y. The fixed portion 34 is a portion fixed to the busbar 2 and is positioned at a distal end portion of the branch portion 31. The intermediate portion 33 extends along the first direction X from the base portion 32 toward the fixed portion 34.

The circuit body 3 includes a plurality of connection conductors 6. The connection conductor 6 of the present embodiment is a conductive metal foil, for example, a copper foil. The connection conductor 6 has a first portion 61 routed in the trunk portion 30 and a second portion 62 routed in the branch portion 31. An end portion of the first portion 61 is connected to the connector 3c. A proximal end of the second portion 62 is connected to the first portion 61. A distal end of the second portion 62 is connected to a chip fuse 3f.

The chip fuse 3f is disposed in the fixed portion 34. The chip fuse 3f is interposed between the second portion 62 and a pad 35. The chip fuse 3f is configured to cut between the pad 35 and the connection conductor 6 when an excessive current flows between the pad 35 and the connection conductor 6. The pad 35 is a metal foil formed on the fixed portion 34, and is exposed to an external space. The busbar 2 is soldered to the pad 35. The pad 35 includes a first pad 35a and a second pad 35b. The first pad 35a and the second pad 35b face each other in the second direction Y with the chip fuse 3f interposed therebetween. The first pad 35a and the second pad 35b are electrically connected to each other.

The circuit body 3 of the present embodiment is connected to the busbar 2 in a state where the intermediate portion 33 of the branch portion 31 is curved. Tolerances in position, height, and the like of the battery cell 120 are absorbed by the branch portion 31 of the circuit body 3. As described later, the branch portion 31 of the present embodiment has a thin portion 3b having a small thickness. The branch portion 31 connects the trunk portion 30 and the busbar 2 in a state where the thin portion 3b is curved. The branch portion 31 having the thin portion 3b has flexibility and high followability. Therefore, the busbar module 1 of the present embodiment can improve workability of attachment work with respect to the battery module 110. In addition, the busbar module 1 of the present embodiment can reduce a reaction force generated in the curved portion to suppress floating or the like of the circuit body 3.

As illustrated in FIG. 6, the case 4 includes a plurality of busbar accommodating portions 40, a plurality of bridge portions 41, and a plurality of coupling portions 42. The case 4 is molded using, for example, an insulating synthetic resin. The busbar accommodating portion 40, the bridge portion 41, and the coupling portion 42 are integrally formed. The case 4 has a rectangular shape elongated in the first direction X.

The busbar accommodating portion 40 is a portion that accommodates the busbar 2 and has a tubular shape in the third direction Z. One busbar accommodating portion 40 accommodates one busbar 2. The plurality of busbar accommodating portions 40 are arranged in the first direction X. The case 4 has a first side 4a and a second side 4b extending along the first direction X. The first side 4a is an edge of one end of the case 4 in the second direction Y. The second side 4b is an edge of the other end of the case 4 in the second direction Y.

The case 4 includes the plurality of busbar accommodating portions 40 arranged on the first side 4a and the plurality of busbar accommodating portions 40 arranged on the second side 4b. The busbar accommodating portion 40 on the first side 4a accommodates the busbar 2 of the first busbar group 2A. The busbar accommodating portion 40 on the second side 4b accommodates the busbar 2 of the second busbar group 2B. The busbar accommodating portion 40 has a partition wall 44. The partition wall 44 partitions between the first connecting portion 20b and the second connecting portion 20c of the busbar 2. The busbar accommodating portion 40 has a facing surface 45 connected to the partition wall 44. The facing surface 45 faces the base portion 20a and the terminal 21 of the busbar 2 in the third direction Z.

The bridge portion 41 connects one busbar accommodating portion 40 arranged on the first side 4a and one busbar accommodating portion 40 arranged on the second side 4b. The plurality of bridge portions 41 are arranged in the first direction X. The bridge portion 41 functions as a support that supports the trunk portion 30 of the circuit body 3. The bridge portion 41 extends in the second direction Y from the partition wall 44 on the first side 4a to the partition wall 44 on the second side 4b. The case 4 includes a first bridge portion 41A and a second bridge portion 41B. The first bridge portion 41A and the second bridge portion 41B are bridge portions 41 positioned at end portions in the first direction X among the plurality of bridge portions 41. The first bridge portion 41A supports the first end portion 30c of the circuit body 3. The second bridge portion 41B supports the second end portion 30d of the circuit body 3.

The coupling portion 42 is a portion that connects two adjacent busbar accommodating portions 40. As illustrated in FIG. 7, the coupling portion 42 has an arch shape. The coupling portion 42 has flexibility and allows relative movement of two adjacent busbar accommodating portions 40. More specifically, the coupling portion 42 is formed to allow the relative movement of the busbar accommodating portions 40 in at least the first direction X. The coupling portion 42 may allow the relative movement of the busbar accommodating portions 40 in the second direction Y and the third direction Z.

The case 4 includes a plurality of engaging pieces 43. The engaging piece 43 is disposed more inwards than the partition wall 44 in the second direction Y. The illustrated engaging piece 43 is provided at an end portion of the bridge portion 41. The engaging piece 43 protrudes in an arm shape in the third direction Z. A claw portion 43a is formed at a distal end portion of the engaging piece 43. The claw portion 43a protrudes in the second direction Y.

As illustrated in FIG. 6, the case 4 includes a first protrusion 46 and a third protrusion 47. The first protrusion 46 is a protrusion corresponding to the first through-hole 30e of the circuit body 3. The first protrusion 46 protrudes from the first bridge portion 41A in the third direction Z. The third protrusion 47 is a protrusion corresponding to the third through-hole 30g of the circuit body 3. The third protrusion 47 protrudes from the second bridge portion 41B in the third direction Z.

The cover 5 is a member that covers the circuit body 3 to protect the circuit body 3. The cover 5 is engaged with the case 4 and forms a space for accommodating the trunk portion 30 between the case 4 and the cover 5. The cover 5 is formed of, for example, an insulating synthetic resin. As illustrated in FIG. 8, the cover 5 includes a cover main body 50, an engaging portion 51, and a second protrusion 53. The cover main body 50, the engaging portion 51, and the second protrusion 53 are integrally formed.

The cover main body 50 has a substantially rectangular flat plate shape. The cover main body 50 has a first side 50a and a second side 50b extending along the first direction X. The first side 50a is an edge of one end of the cover main body 50 in the second direction Y. The second side 50b is an edge of the other end of the cover main body 50 in the second direction Y. As illustrated in FIG. 2, a plurality of reinforcing ribs 54 are provided on an outer surface 50d of the cover main body 50. The ribs 54 extend in the first direction X and the second direction Y.

As illustrated in FIGS. 2 and 8, the cover 5 includes a plurality of engaging portions 51. The engaging portion 51 engages with the engaging piece 43 of the case 4 to couple the cover 5 to the case 4. The engaging portions 51 are disposed on the first side 50a and the second side 50b. As illustrated in FIG. 8, the engaging portion 51 has a rectangular tube shape having an engaging hole 52. The engaging piece 43 of the case 4 is inserted into the engaging hole 52 in such a manner that the claw portion 43a protrudes from the engaging hole 52. The claw portion 43a of the engaging piece 43 is locked to the engaging portion 51 to couple the case 4 and the cover 5 with each other.

A length of the engaging hole 52 in the first direction X is sufficiently larger than a width of the engaging piece 43. Therefore, the engaging portion 51 allows the engaging piece 43 to relatively move in the first direction X with respect to the engaging portion 51. That is, the cover 5 allows the case 4 to expand and contract in the first direction X in a coupled state in which the cover 5 and the case 4 are coupled. The expansion and contraction of the case 4 is mainly caused by elastic deformation of the coupling portion 42. That is, the cover 5 allows two adjacent busbar accommodating portions 40 to relatively move in the first direction X in the coupled state.

The second protrusion 53 protrudes from an inner surface 50c of the cover main body 50. The second protrusion 53 is a protrusion corresponding to the second through-hole 30f of the circuit body 3. The illustrated shape of the second protrusion 53 is a columnar shape.

Details of the circuit body 3 will be described. FIG. 9 is a diagram for describing an internal configuration of the circuit body 3. FIG. 9 illustrates the branch portion 31 before being attached to the busbar 2 and the battery module 110. In FIG. 9, the connection conductor 6 is drawn by a solid line, but in the actual circuit body 3, the connection conductor 6 is covered with coating layers 11 and 12 to be described later and is thus not exposed.

The circuit body 3 of the present embodiment has a thick portion 3a illustrated in FIG. 10 and the thin portion 3b illustrated in FIG. 11. The thick portion 3a has a five-layer structure. On the other hand, the thin portion 3b has a three-layer structure. In the circuit body 3, at least the trunk portion 30 is composed of the thick portion 3a. Since conductor layers 13 and 14 are disposed on both surfaces of a base layer 10, respectively, both downsizing of the trunk portion 30 and routing of a large number of voltage detection circuits due to the multilayer structure are achieved. The thin portion 3b is provided at the intermediate portion 33 of the branch portion 31. The branch portion 31 connects the trunk portion 30 and the busbar 2 in a state where the thin portion 3b is flexurally deformed. Since the thin portion 3b having high flexibility is provided at the intermediate portion 33, workability of work of attaching the busbar 2 to the battery module 110 is improved.

As illustrated in FIG. 10, the thick portion 3a has a five-layer structure including a first circuit layer 7A and a second circuit layer 7B. The thick portion 3a includes the base layer 10, the first coating layer 11, the second coating layer 12, the first conductor layer 13, and the second conductor layer 14. The base layer 10, the first coating layer 11, and the second coating layer 12 are all formed of an insulating synthetic resin. The base layer 10, the first coating layer 11, and the second coating layer 12 are formed of, for example, a polyimide resin. Both the base layer 10 and the coating layers 11 and 12 are formed to have flexibility.

The first coating layer 11 is a layer that covers a first surface 10a of the base layer 10. The second coating layer 12 is a layer that covers a second surface 10b of the base layer 10. The first conductor layer 13 is a conductor layer disposed between the first surface 10a and the first coating layer 11, and has flexibility. The illustrated first conductor layer 13 is a metal foil formed on the first surface 10a. The first conductor layer 13 is typically the connection conductor 6. A part of the first conductor layer 13 may be a reinforcing layer 36 as described later. The connection conductor 6 and the reinforcing layer 36 are formed by etching the metal foil formed on the first surface 10a. After a circuit pattern or the like of the connection conductor 6 is formed on the first surface 10a, the first coating layer 11 is bonded to the first surface 10a and the first conductor layer 13.

The illustrated second conductor layer 14 is a metal foil formed on the second surface 10b and has flexibility. The second conductor layer 14 is typically the connection conductor 6. A part of the second conductor layer 14 may be the reinforcing layer 36. The connection conductor 6 and the reinforcing layer 36 are formed by etching the metal foil formed on the second surface 10b. After a circuit pattern or the like of the connection conductor 6 is formed on the second surface 10b, the second coating layer 12 is bonded to the second surface 10b and the second conductor layer 14.

FIG. 11 illustrates the thin portion 3b composed of the first circuit layer 7A. The illustrated thin portion 3b has a three-layer structure including the base layer 10, the first coating layer 11, and the first conductor layer 13. In this case, no metal foil is formed on the second surface 10b of the base layer 10, or the metal foil on the second surface 10b is removed by etching. Since the thin portion 3b is thinner than the thick portion 3a, the thin portion 3b has lower rigidity than that of the thick portion 3a and has flexibility. The thin portion 3b may be composed of the second circuit layer 7B.

As illustrated in FIG. 9, the thin portion 3b is provided at the intermediate portion 33 of the branch portion 31. More specifically, substantially the entire intermediate portion 33 is the thin portion 3b. Therefore, the illustrated branch portion 31 can connect the trunk portion 30 and the busbar 2 in a state where the entire intermediate portion 33 is flexurally deformed. A shape of the thin portion 3b in plan view is substantially rectangular. More specifically, the illustrated thin portion 3b has a shape in which a rectangular end portion is curved outward. In the branch portion 31, a portion excluding the thin portion 3b is composed of the thick portion 3a. That is, in the circuit body 3, the trunk portion 30, the base portion 32, and the fixed portion 34 are composed of the thick portion 3a.

As illustrated in FIG. 9, the circuit body 3 of the present embodiment includes the reinforcing layer 36. The reinforcing layer 36 is a metal foil that improves rigidity of a portion adjacent to the thin portion 3b. The reinforcing layer 36 and the connection conductor 6 are separated from each other by etching the same copper foil, for example. Note that the reinforcing layer 36 may be a metal foil thicker than the connection conductor 6. For example, the reinforcing layer 36 is disposed on a back side of the corresponding connection conductor 6. For example, in a case where the connection conductor 6 of the branch portion 31 illustrated in FIG. 9 is disposed on the first surface 10a of the base layer 10, the reinforcing layer 36 is disposed on the second surface 10b. A width of the reinforcing layer 36 is larger than a width of the connection conductor 6.

The reinforcing layer 36 includes a first reinforcing layer 36a and a second reinforcing layer 36b. The first reinforcing layer 36a is disposed at the trunk portion 30 and the base portion 32. The second reinforcing layer 36b is disposed at the fixed portion 34. The first reinforcing layer 36a has a first portion 36c disposed at the trunk portion 30 and a second portion 36d disposed at the base portion 32. The first portion 36c and the second portion 36d are integrated with each other.

The first portion 36c extends from a connecting portion 37 that connects the trunk portion 30 and the branch portion 31 toward both sides in the first direction X. A shape of the first portion 36c in plan view is substantially rectangular. A width of the first portion 36c is the largest at the connecting portion 37.

The second portion 36d is provided in substantially the entire region of the base portion 32. That is, the second portion 36d extends from the connecting portion 37 to a distal end of the base portion 32 in the second direction Y. A width of the second portion 36d is slightly smaller than a width of the base portion 32.

The first reinforcing layer 36a improves rigidity of the connecting portion 37 and suppresses bending and twisting of the connecting portion 37. In addition, the first reinforcing layer 36a improves rigidity of the base portion 32 and suppresses bending and twisting of the base portion 32. Therefore, the first reinforcing layer 36a enables flexural deformation of the intermediate portion 33 into a desired shape while suppressing deformation of the base portion 32 and the connecting portion 37.

The second reinforcing layer 36b is provided in substantially the entire region of the fixed portion 34. The illustrated second reinforcing layer 36b faces each of the second portion 62 of the connection conductor 6, the first pad 35a, and the second pad 35b. The second reinforcing layer 36b improves rigidity of the fixed portion 34 and suppresses bending and twisting of the fixed portion 34. Therefore, the second reinforcing layer 36b can improve reliability of electrical performance in the fixed portion 34.

As illustrated in FIG. 12, a thickness t2 of the thin portion 3b is smaller than a thickness t1 of the thick portion 3a. The thin portion 3b is provided from one end to the other end of the intermediate portion 33. Therefore, the branch portion 31 can connect the trunk portion 30 and the busbar 2 while flexurally deforming the intermediate portion 33 into a desired curved shape. The illustrated curved shape of the intermediate portion 33 is an S-shape. The intermediate portion 33 is bent so as to have a first curved portion 33a and a second curved portion 33b. The first curved portion 33a is curved toward one side in the first direction X. The second curved portion 33b is curved toward the other side in the first direction X. The intermediate portion 33 curved in the S-shape can appropriately absorb tolerances in the first direction X, the second direction Y, and the third direction Z.

In addition, since the thickness t2 of the intermediate portion 33 is small, a reaction force generated in the intermediate portion 33 is reduced. For example, the reaction force generated in the intermediate portion 33 is smaller than that in a case where the intermediate portion 33 is composed of the thick portion 3a. Therefore, the busbar module 1 of the present embodiment can improve workability of work of fixing the busbar 2 to the battery cell 120. In addition, the busbar module 1 can suppress floating and deformation of the circuit body 3 after the busbar 2 is fixed to the battery cell 120.

Note that the branch portion 31 of the circuit body 3 may be connected to an electronic component or element different from the chip fuse 3*f*. For example, as illustrated in FIG. 13, the circuit body 3 of the present embodiment includes a branch portion 31 connected to a thermistor 3*s*. The thermistor 3*s* is fixed to the battery cell 120 and detects a temperature of the battery cell 120. The detection result of the thermistor 3*s* is output to the monitoring device via the connection conductor 6.

The branch portion 31 illustrated in FIG. 13 has an extension portion 38 connected to the thermistor 3*s*. The extension portion 38 extends from the fixed portion 34 to the thermistor 3*s* in the first direction X. Two connection conductors 6 are routed in the branch portion 31. One of the two connection conductors 6 is a voltage detection line connected to the busbar 2 via the chip fuse 3*f*. The other of the two connection conductors 6 is a temperature detection line connected to the thermistor 3*s* from the fixed portion 34 via the extension portion 38. The extension portion 38 connects the fixed portion 34 and the thermistor 3*s* in a flexurally deformed state. The thin portion 3*b* may be provided at the extension portion 38. For example, the entire extension portion 38 may be the thin portion 3*b*.

As described below, the case 4 of the present embodiment can hold the circuit body 3 in a state where the intermediate portion 33 is flexurally deformed. As illustrated in FIGS. 14 and 15, the first protrusion 46 of the case 4 includes a shaft portion 46*a* and an eaves portion 46*b*. The shaft portion 46*a* is a proximal end portion of the first protrusion 46, and is connected to the first bridge portion 41A. A shape of the shaft portion 46*a* is a columnar shape along the third direction Z. The eaves portion 46*b* protrudes from a distal end of the shaft portion 46*a*. A shape of the eaves portion 46*b* is a columnar shape along the third direction Z. A value of an outer diameter of the eaves portion 46*b* is, for example, the same as a value of an outer diameter of the shaft portion 46*a*. The eaves portion 46*b* is positioned on an axis different from an axis of the shaft portion 46*a*, and is eccentric with respect to the shaft portion 46*a*. The illustrated eaves portion 46*b* is shifted with respect to the shaft portion 46*a* in the first direction X.

Attachment of the circuit body 3 to the case 4 will be described with reference to FIGS. 16 and 17. FIG. 16 illustrates a state in which the busbar 2 is accommodated in the busbar accommodating portion 40. The busbar 2 is fixed to the fixed portion 34 in advance. An operator places the trunk portion 30 of the circuit body 3 on the bridge portion 41 of the case 4 and makes the busbar 2 be accommodated in the corresponding busbar accommodating portion 40. The busbar accommodating portion 40 accommodates the busbar 2 and positions the busbar 2 and the fixed portion 34. The shape of the intermediate portion 33 of the branch portion 31 at this time is a shape before being bent into an S-shape.

As indicated by an arrow Ar1 in FIG. 17, the operator inserts the first protrusion 46 into the first through-hole 30*e* of the circuit body 3 while pulling the trunk portion 30 in the first direction X. The circuit body 3 is configured in such a manner that the intermediate portion 33 is curved into a desired S-shape when the first through-hole 30*e* is positioned at the first protrusion 46. Therefore, the operator can flexurally deform each intermediate portion 33 into an S-shape by inserting the first protrusion 46 into the first through-hole 30*e*.

The operator hooks the first through-hole 30*e* on the shaft portion 46*a* of the first protrusion 46. The outer diameter of the shaft portion 46*a* is equal to an inner diameter of the first through-hole 30*e*. Therefore, the shaft portion 46*a* can position the trunk portion 30 at a predetermined position in the first direction X. The eaves portion 46*b* protrudes in a direction opposite to a direction of a reaction force F1 generated by the branch portion 31. Therefore, the eaves portion 46*b* restricts the trunk portion 30 from being detached from the first protrusion 46.

The first protrusion 46 locks the first end portion 30*c* of the trunk portion 30 while being inserted into the first through-hole 30*e*. The first protrusion 46 locks the first end portion 30*c* against the reaction force F1 and holds the first end portion 30*c* at a predetermined position. With such a configuration, the first protrusion 46 can hold the circuit body 3 in a state where the intermediate portion 33 of the circuit body 3 is flexurally deformed.

As illustrated in FIGS. 14 and 15, the case 4 includes an engaging piece 48 that positions the cover 5 in the first direction X. The engaging piece 48 protrudes from the first bridge portion 41A in the third direction Z. The engaging piece 48 is disposed in the vicinity of the first protrusion 46 in the first direction X. A shape of the engaging piece 48 is similar to a shape of the engaging piece 43. As illustrated in FIG. 15, a claw portion 48*a* of the engaging piece 48 protrudes in the first direction X. As illustrated in FIG. 2, the cover 5 includes an engaging portion 55 corresponding to the engaging piece 48. The engaging piece 48 is engaged with the engaging portion 55 to restrict relative movement of the cover 5 with respect to the first bridge portion 41A.

In the busbar module 1 of the present embodiment, the curved shape of the intermediate portion 33 can be maintained by the second protrusion 53 of the cover 5. As illustrated in FIG. 18, the second protrusion 53 is coupled to the case 4 while being inserted into the second through-hole 30*f* of the circuit body 3. The second protrusion 53 limits a movement range of the second end portion 30*d* in the first direction X. A movable range of the second end portion 30*d* is determined by a length L1 of the second through-hole 30*f*.

For example, in a case where the second end portion 30*d* moves relative to the cover 5 in a direction of an arrow X1, the second protrusion 53 locks the second end portion 30*d*. The direction of the arrow X1 is a direction in which the second end portion 30*d* approaches the first end portion 30*c* in the first direction X. When the second end portion 30*d* moves in the direction of the arrow X1, flexure may occur at the trunk portion 30. Therefore, the second protrusion 53 suppresses the movement range of the second end portion 30*d* to suppress the flexure of the trunk portion 30. The second protrusion 53 can maintain the desired curved shape of the intermediate portion 33 by limiting the movement of the second end portion 30*d*.

As described above, the cover 5 of the present embodiment includes the flat cover main body 50. The cover main body 50 is formed in a single plate shape and has high rigidity against a force in the first direction X. On the other hand, the case 4 can expand and contract in the first direction X so that the busbar 2 can follow the battery cell 120. As described below, the cover 5 of the present embodiment can restrict the flexure of the trunk portion 30 caused by the expansion and contraction of the case 4.

The cover 5 is engaged with the engaging piece 48 of the case 4 at the engaging portion 55 (see FIG. 2), and is positioned with respect to the first protrusion 46. In other words, the engaging portion 55 is positioned with respect to the first through-hole 30*e* of the circuit body 3 via the engaging piece 48 and the first protrusion 46. Further, the cover 5 locks the second through-hole 30f of the circuit body 3 by the second protrusion 53. In this manner, the cover 5 is positioned with respect to one end of the trunk portion 30 and locks the other end of the trunk portion 30, such that it is possible to appropriately suppress the flexure of the trunk portion 30.

As illustrated in FIG. 19, the branch portion 31 is fixed to the terminal 21 in a state where the fixed portion 34 faces the first surface 21a of the terminal 21. That is, the branch portion 31 is routed under the terminal 21. A surface of the fixed portion 34 on which the chip fuse 3f is mounted faces the first surface 21a of the terminal 21. The busbar 2 overlaps the fixed portion 34 so as to expose the chip fuse 3f to the through-hole 21c. As described above, the terminal 21 is fixed to the fixed portion 34 by being soldered to the pad 35 of the fixed portion 34.

The through-hole 21c of the terminal 21 is filled with a potting agent 8. The potting agent 8 filling the through-hole 21c covers the chip fuse 3f to protect the chip fuse 3f. For example, the potting agent 8 fills the through-hole 21c so as to cover each side surface and an upper surface of the chip fuse 3f. Filling with the potting agent 8 may be made to protect a connecting portion between the pad 35 and the terminal 21. The circuit body 3 and the busbar 2 are attached to the case 4 in a state where the intermediate portion 33 of the branch portion 31 is flexurally deformed into an S-shape. The busbar 2 is accommodated in the busbar accommodating portion 40.

As illustrated in FIG. 19, the branch portion 31 has a facing portion 39. The facing portion 39 is a portion of the branch portion 31 that faces the first surface 21a of the terminal 21. The busbar 2 of the present embodiment has a groove-shaped recess 22 formed in the first surface 21a. As described below, the busbar 2 having the recess 22 can suppress damage to the connection conductor 6.

As illustrated in FIGS. 19 and 20, the recess 22 is disposed at a position facing the connection conductor 6 of the branch portion 31. As illustrated in FIG. 21, the recess 22 extends in the first direction X from a side surface 21d of the terminal 21 to the through-hole 21c. A shape of the recess 22 when viewed in the first direction X is a rectangular shape or a trapezoidal shape. The terminal 21 illustrated in FIG. 21 has two recesses 22. The two recesses 22 are disposed on both sides of the through-hole 21c in the first direction X, respectively. Therefore, in the terminal 21, the recess 22 can face the connection conductor 6 even in a case where the connection conductor 6 is routed on any side in the first direction X with respect to the through-hole 21c.

As described above, the connection conductor 6 of the present embodiment is a metal foil such as a copper foil. In the branch portion 31 illustrated in FIG. 20, the connection conductor 6 of the first circuit layer 7A is connected to the busbar 2. The illustrated connection conductor 6 is formed on the first surface 10a of the base layer 10. The first coating layer 11 is attached to the base layer 10 on which the connection conductor 6 is formed. The branch portion 31 is fixed to the busbar 2 in such a manner that the first coating layer 11 faces the first surface 21a of the terminal 21 and the connection conductor 6 faces the recess 22.

Since the recess 22 faces the connection conductor 6, the connection conductor 6 is less likely to be damaged. For example, when the branch portion 31 vibrates or is bent, the connection conductor 6 is prevented from being damaged by the terminal 21.

The first coating layer 11 may have a raised portion 11a corresponding to the connection conductor 6. A width of the recess 22 is larger than the width of the connection conductor 6 and a width of the raised portion 11a. The width of the recess 22 is determined in such a manner that the recess 22 can face the connection conductor 6 even in a case where the connection conductor 6 is out of position due to tolerance, for example. A depth of the recess 22 is, for example, equal to or greater than a thickness of the connection conductor 6. The depth of the recess 22 may be equal to or greater than a height of the raised portion 11a in design.

In the busbar module 1 of the present embodiment, since the recess 22 is provided in the busbar 2, leakage of the potting agent 8 can be suppressed. A comparative example in which the terminal 21 does not have the recess 22 will be described. In the comparative example, the raised portion 11a comes into contact with the first surface 10a, and a gap is generated in a wide range between the fixed portion 34 and the first surface 10a. As a result, the potting agent 8 easily leaks out from the gap. On the other hand, in the busbar module 1 of the present embodiment, a portion of the first surface 10a excluding the recess 22 can be brought into contact with the fixed portion 34 or can be sufficiently close to the fixed portion 34. Therefore, leakage of the potting agent 8 filling the through-hole 21c is suppressed.

From the viewpoint of suppressing leakage of the potting agent 8, it is preferable that the depth of the recess 22 is not excessively large. On the other hand, from the viewpoint of suppressing damage to the connection conductor 6, the depth of the recess 22 is preferably not excessively small. The depth of the recess 22 is preferably determined within a range in which leakage of the potting agent 8 can be suppressed according to the viscosity of the potting agent 8, for example. As an example, the depth of the recess 22 may be set to a maximum value at which leakage of the potting agent 8 can be suppressed.

Note that, as illustrated in FIG. 13, the branch portion 31 of the circuit body 3 may include the branch portion 31 connected to the thermistor 3s. In this case, each of two connection conductors 6 preferably faces the recess 22 of the terminal 21. With such a configuration, the voltage detection line and the temperature detection line are less likely to be damaged by the terminal 21.

As described above, the busbar module 1 of the present embodiment includes the plurality of busbars 2 and the plate-like circuit body 3 having flexibility. The busbar 2 is fixed to the battery cell 120 of the battery module 110. The circuit body 3 includes a plurality of connection conductors 6 corresponding to the plurality of busbars 2. The circuit body 3 includes the trunk portion 30 and the plurality of branch portions 31. The trunk portion 30 extends in the first direction X in which the plurality of battery cells 120 are arranged. The plurality of branch portions 31 branch from the trunk portion 30 and are connected to the busbars 2.

The circuit body 3 includes the first circuit layer 7A and the second circuit layer 7B. The first circuit layer 7A is composed of the base layer 10, the first coating layer 11 covering the first surface 10a of the base layer 10, and the first conductor layer 13 disposed between the first surface 10a and the first coating layer 11. The second circuit layer 7B is composed of the base layer 10, the second coating layer 12 covering the second surface 10b of the base layer 10, and the second conductor layer 14 disposed between the second surface 10b and the second coating layer 12.

The branch portion 31 has the thin portion 3b configured with any one of the first circuit layer 7A and the second circuit layer 7B. The branch portion 31 connects the trunk portion 30 and the busbar 2 in a state where the thin portion 3b is flexurally deformed. The busbar module 1 of the present embodiment has the thin portion 3b provided at the branch portion 31. Therefore, the busbar module 1 of the present embodiment can improve workability in an attachment process of fixing the busbar 2 to the battery cell 120 in a state where the branch portion 31 is flexurally deformed.

The branch portion 31 of the present embodiment includes the base portion 32, the fixed portion 34, and the intermediate portion 33. The base portion 32 is a portion protruding from the trunk portion 30 in a direction intersecting the first direction X. The fixed portion 34 is a portion fixed to the busbar 2. The intermediate portion 33 is a portion extending from the base portion 32 to the fixed portion 34 in the first direction X. The thin portion 3b is provided at the intermediate portion 33. In the branch portion 31 of the present embodiment, tolerance can be appropriately absorbed by the intermediate portion 33 having the thin portion 3b.

The base portion 32 of the present embodiment includes both the first circuit layer 7A and the second circuit layer 7B. Since the rigidity of the base portion 32 is improved, it is easy to deform the intermediate portion 33 into a desired flexure shape.

The connection conductor 6 of the present embodiment is a metal foil. One of the first conductor layer 13 and the second conductor layer 14 included in the base portion 32 is composed of the connection conductor 6. The other of the first conductor layer 13 and the second conductor layer 14 included in the base portion 32 is the reinforcing layer 36 formed of a metal foil. The reinforcing layer 36 is insulated from the connection conductor 6. Since the connection conductor 6 and the reinforcing layer 36 are formed of metal foils, reinforcement of the base portion 32 is realized at low cost.

Note that the circuit body 3 is not limited to the flexible printed circuit board, and may be a flat cable (so-called FC), a flexible flat cable (so-called FFC), or the like.

The shape of the flexurally deformed intermediate portion 33 in a state where the busbar 2 is fixed to the battery cell 120 is not limited to the illustrated S-shape. The intermediate portion 33 may be flexurally deformed so as to be able to absorb positional deviation caused by tolerance.

Modified Example of Embodiment

A modified example of the embodiment will be described. By reducing the thickness of the first coating layer 11 or the second coating layer 12, the rigidity of the thin portion 3b may be reduced. For example, in a case where the thin portion 3b is composed of the first circuit layer 7A, the thickness of the first coating layer 11 in the thin portion 3b may be smaller than the thickness of the first coating layer 11 in the thick portion 3a.

The circuit body 3 may include another circuit layer in addition to the first circuit layer 7A and the second circuit layer 7B. In other words, the circuit body 3 may have a multilayer structure including six or more layers. For example, the thick portion 3a may include a third circuit layer stacked on the first circuit layer 7A or the second circuit layer 7B. The third circuit layer includes, for example, a third conductor layer and a third coating layer. The thick portion 3a in this case has a seven-layer structure.

The disposition and shape of the first protrusion 46 in the case 4 are not limited to the illustrated disposition and shape. For example, the first protrusion 46 may be disposed on the second bridge portion 41B. In this case, the first through-hole 30e is disposed at the second end portion 30d of the circuit body 3, and the second through-hole 30f is disposed at the first end portion 30c. The second protrusion 53 of the cover 5 is disposed at a position corresponding to the second through-hole 30f.

The disposition and shape of the recess 22 are not limited to the illustrated disposition and shape. For example, a cross-sectional shape of the recess 22 may be an arc shape or a triangular shape.

A connection target to which the metal foil of the branch portion 31 is connected is not limited to an electronic component or element. For example, the metal foil of the branch portion 31 may be connected to the terminal 21 of the busbar 2 without interposing an electronic component or element therebetween.

The contents disclosed in the above embodiment and modified example can be appropriately combined and executed.

In the busbar module according to the embodiment, the branch portion has the thin portion composed of any one of the first circuit layer and the second circuit layer, and connects the trunk portion and the busbar in a state where the thin portion is flexurally deformed. With the busbar module of the embodiment, it is possible to implement both the multilayer structure of the connection conductor with the simple configuration and the flexibility of the branch portion.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A busbar module comprising:
a plurality of busbars configured to be fixed to a plurality of battery cells of a battery module including the plurality of battery cells; and
a plate-like flexible circuit body that includes a plurality of connection conductors corresponding to the plurality of busbars, wherein
the circuit body includes a trunk portion extending in a first direction in which the plurality of battery cells are arranged, and a plurality of branch portions branching from the trunk portion and connected to the busbars,
the circuit body includes a first circuit layer and a second circuit layer,
the first circuit layer is composed of a base layer, a first coating layer covering a first surface of the base layer, and a first conductor layer disposed between the first surface and the first coating layer,
the second circuit layer is composed of the base layer, a second coating layer covering a second surface of the base layer, and a second conductor layer disposed between the second surface and the second coating layer,
the branch portion has a thin portion composed of any one of the first circuit layer and the second circuit layer, and connects the trunk portion and the busbar in a state where the thin portion is flexurally deformed, and
the thin portion has a shape in which a rectangular end portion is curved outward.

2. The busbar module according to claim 1, wherein
the branch portion includes a base portion protruding from the trunk portion in a direction intersecting the first direction, a fixed portion fixed to the busbar, and an intermediate portion extending from the base portion to the fixed portion in the first direction, and
the thin portion is provided at the intermediate portion.

3. The busbar module according to claim 2, wherein
the base portion includes both the first circuit layer and the second circuit layer.

4. The busbar module according to claim 3, wherein
the connection conductor is a metal foil,
one of the first conductor layer and the second conductor layer included in the base portion is composed of the connection conductor, and
the other of the first conductor layer and the second conductor layer included in the base portion is a reinforcing layer formed of a metal foil, the reinforcing layer being insulated from the connection conductor.

\* \* \* \* \*